United States Patent
Kobayashi et al.

(10) Patent No.: US 11,696,054 B2
(45) Date of Patent: Jul. 4, 2023

(54) IMAGING APPARATUS, IMAGING ELEMENT, OPERATION METHOD OF IMAGING APPARATUS, OPERATION METHOD OF IMAGING ELEMENT, AND PROGRAM FOR COMBINING IMAGE DATA HAVING A GREATER NUMBER OF BITS

(71) Applicant: FUJIFILM CORPORATION, Tokyo (JP)

(72) Inventors: Makoto Kobayashi, Saitama (JP); Tomoyuki Kawai, Saitama (JP); Hitoshi Sakurabu, Saitama (JP); Ryo Hasegawa, Saitama (JP); Kazufumi Sugawara, Saitama (JP)

(73) Assignee: FUJIFILM CORPORATION, Tokyo (JP)

( * ) Notice: Subject to any disclaimer, the term of this patent is extended or adjusted under 35 U.S.C. 154(b) by 26 days.

(21) Appl. No.: 17/577,414

(22) Filed: Jan. 18, 2022

(65) Prior Publication Data

US 2022/0141415 A1 May 5, 2022

Related U.S. Application Data

(63) Continuation of application No. PCT/JP2020/025832, filed on Jul. 1, 2020.

(30) Foreign Application Priority Data

Jul. 26, 2019 (JP) .............................. JP2019-138237

(51) Int. Cl.
*H04N 25/772* (2023.01)
*H04N 25/75* (2023.01)
(Continued)

(52) U.S. Cl.
CPC ........... *H04N 25/772* (2023.01); *H04N 23/45* (2023.01); *H04N 25/75* (2023.01); *H04N 25/771* (2023.01)

(58) Field of Classification Search
CPC .... H04N 25/771; H04N 25/75; H04N 25/772; H04N 23/45
See application file for complete search history.

(56) References Cited

U.S. PATENT DOCUMENTS 7,995,124 B2 * 8/2011 Dai ...................... H04N 23/741
348/300
9,531,961 B2 * 12/2016 Rivard ................... H04N 23/45
(Continued)

FOREIGN PATENT DOCUMENTS

JP    H09-23372 A     1/1997
JP    H11-341327 A   12/1999
(Continued)

OTHER PUBLICATIONS

International Search Report issued in International Application No. PCT/JP2020/025832 dated Sep. 1, 2020.
(Continued)

*Primary Examiner* — Nicholas G Giles
(74) *Attorney, Agent, or Firm* — Solaris Intellectual Property Group, PLLC

(57) ABSTRACT

An imaging apparatus includes an imaging element, and a processing portion that generates single image data by combining a plurality of pieces of image data output from the imaging element and outputs the generated single image data, in which the plurality of pieces of image data are image data generated by performing imaging accompanying A/D conversion of different reference levels, and the number of bits, in units of pixels, of the single image data output from the processing portion is greater than the number of bits of
(Continued)

each of the plurality of pieces of image data in units of pixels.

18 Claims, 28 Drawing Sheets

(51) Int. Cl.
*H04N 25/771* (2023.01)
*H04N 23/45* (2023.01)

(56) References Cited

U.S. PATENT DOCUMENTS

| | | |
|---|---|---|
| 2008/0218619 A1 | 9/2008 | Egawa |
| 2009/0073274 A1* | 3/2009 | Dai ................. H04N 25/57 348/222.1 |
| 2009/0284618 A1 | 11/2009 | Kurahashi et al. |
| 2011/0228130 A1 | 9/2011 | Egawa |
| 2011/0228152 A1 | 9/2011 | Egawa |
| 2011/0317039 A1 | 12/2011 | Ise |
| 2015/0109506 A1 | 4/2015 | Aibara et al. |
| 2016/0323518 A1* | 11/2016 | Rivard ................. H04N 23/45 |
| 2017/0251158 A1 | 8/2017 | Aibara et al. |

FOREIGN PATENT DOCUMENTS

| | | |
|---|---|---|
| JP | 2008-124842 A | 5/2008 |
| JP | 2009-276956 A | 11/2009 |
| JP | 2012-15599 A | 1/2012 |
| JP | 2015-80132 A | 4/2015 |
| JP | 2017-5612 A | 1/2017 |

OTHER PUBLICATIONS

Written Opinion of the ISA issued in International Application No. PCT/JP2020/025832 dated Sep. 1, 2020.
International Preliminary Report on Patentability issued in International Application No. PCT/JP2020/025832 dated Apr. 19, 2021.

* cited by examiner

[ROLLING SHIFT IN CASE OF PERFORMING
A/D CONVERSION OF FEW BITS]

[ROLLING SHIFT IN CASE OF PERFORMING
A/D CONVERSION OF FEW TENS OF BITS]

FIG. 19
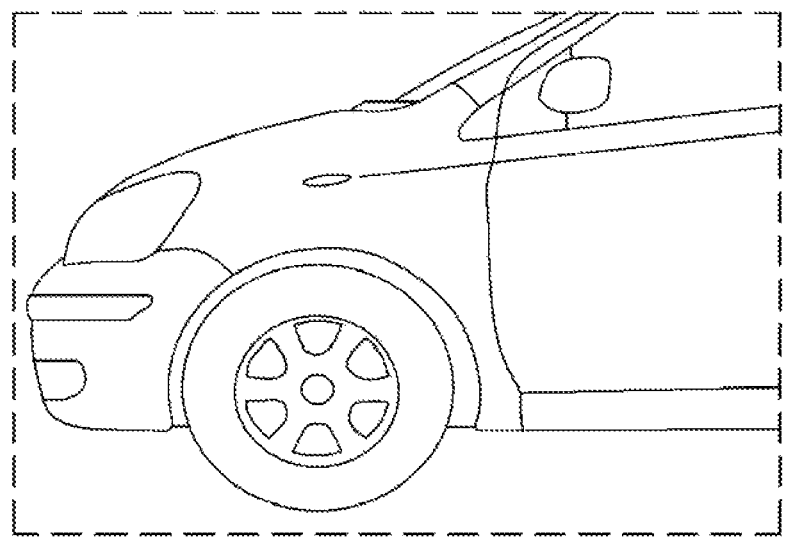
[IMAGE OBTAINED IN CASE OF PERFORMING
A/D CONVERSION OF FEW BITS]
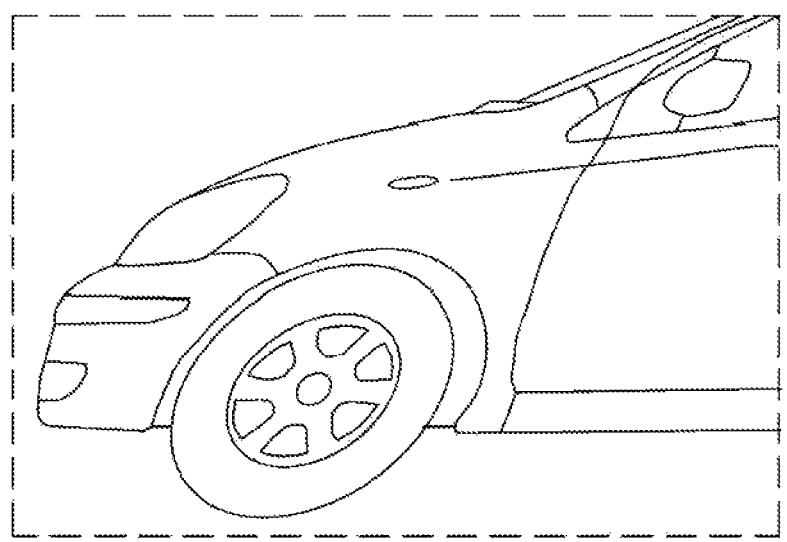
[IMAGE OBTAINED IN CASE OF PERFORMING
A/D CONVERSION OF FEW TENS OF BITS]

IMAGING APPARATUS, IMAGING ELEMENT, OPERATION METHOD OF IMAGING APPARATUS, OPERATION METHOD OF IMAGING ELEMENT, AND PROGRAM FOR COMBINING IMAGE DATA HAVING A GREATER NUMBER OF BITS

CROSS-REFERENCE TO RELATED APPLICATIONS

This application is a continuation application of International Application No. PCT/JP2020/025832, filed Jul. 1, 2020, the disclosure of which is incorporated herein by reference in its entirety. Further, this application claims priority from Japanese Patent Application No. 2019-138237, filed Jul. 26, 2019, the disclosure of which is incorporated herein by reference in its entirety.

BACKGROUND

1. Technical Field of the Invention

The technology of the present disclosure relates to an imaging apparatus, an imaging element, an operation method of an imaging apparatus, an operation method of an imaging element, and a program.

2. Related Art

JP2012-15599A discloses an imaging apparatus including pixels comprising two-dimensionally arranged photoelectric conversion elements, a column amplifier disposed for each column of the photoelectric conversion elements, and an AD converter disposed on an output side of the column amplifier. In the imaging apparatus disclosed in JP2012-15599A, the AD converter has a first operation mode for operating at a first conversion speed in a first number of conversion bits and a second operation mode for operating at a second conversion speed higher than the first conversion speed in a second number of conversion bits less than the first number of conversion bits. An expansion processing section that expands the number of gradation bits from the second number of conversion bits by adding a plurality of pieces of two-dimensionally arranged pixel data output from the AD converter in the second operation mode is included.

JP2008-124842A discloses a solid-state imaging device including a pixel portion, an exposure time period control section, an AD conversion section, a line memory, and a signal processing section. The pixel portion of the solid-state imaging device disclosed in JP2008-124842A is a pixel portion in which cells are two-dimensionally arranged in rows and columns on a semiconductor substrate. Here, each cell comprises a photoelectric conversion section, a reading section that reads out signal electric charges obtained by photoelectrically converting an incidence ray using the photoelectric conversion section to a detection portion, an amplification section that amplifies a voltage corresponding to the signal electric charges accumulated in the detection portion and outputs the amplified voltage, and a reset section that resets the signal electric charges of the detection portion.

In the solid-state imaging device disclosed in JP2008-124842A, the exposure time period control section controls an exposure time period for performing photoelectric conversion using the photoelectric conversion section and sets the same exposure time period in the entire pixel portion. The AD conversion section performs AD conversion on a signal output from the pixel portion using different resolving powers for a signal level. The line memory stores the signal converted by the AD conversion section. The signal processing section controls an amplification ratio for an output signal from the line memory in accordance with the resolving power for the pixel output signal after the AD conversion, and performs processing for having a linear inclination for an optical input signal amount.

In addition, the AD conversion section of the solid-state imaging device disclosed in JP2008-124842A performs the AD conversion on the signal output from the pixel portion a plurality of times. A plurality of the line memories store the signals after the plurality of times of the AD conversion. The signal processing section combines a plurality of signals read out from the plurality of line memories at the same time into one signal.

JP2015-80132A discloses a solid-state imaging element comprising a pixel circuit that outputs a voltage of a level corresponding to illuminance, and an A/D converter that converts the output voltage of the pixel circuit into a digital signal. In the solid-state imaging element disclosed in JP2015-80132A, a resolving power on a low illuminance side of the A/D converter is higher than a resolving power on a high illuminance side. In addition, the solid-state imaging element disclosed in JP2015-80132A comprises a control portion that exposes the pixel circuit a plurality of times by changing an exposure time period within one frame period, converts a plurality of the output voltages of the pixel circuit into a plurality of the digital signals using the A/D converter, and combines the plurality of digital signals.

SUMMARY

One embodiment according to the technology of the present disclosure provides an imaging apparatus, an imaging element, an operation method of an imaging apparatus, an operation method of an imaging element, and a program that can implement a high frame rate and high image quality, compared to a case where imaging accompanying A/D conversion of the same reference level is performed at all times.

A first aspect according to the technology of the present disclosure is an imaging apparatus comprising an imaging element, and a processing portion that generates single image data by combining a plurality of pieces of image data output from the imaging element and outputs the generated single image data, in which the plurality of pieces of image data are image data generated by performing imaging accompanying A/D conversion of different reference levels, and the number of bits, in units of pixels, of the single image data output from the processing portion is greater than the number of bits of each of the plurality of pieces of image data in units of pixels.

A second aspect according to the technology of the present disclosure is the imaging apparatus according to the first aspect, in which the imaging element generates the plurality of pieces of image data by performing the imaging accompanying the A/D conversion of different reference levels for a plurality of divided regions obtained by dividing a pixel region of the imaging element, and the processing portion generates the single image data by combining the plurality of pieces of image data generated for the plurality of divided regions.

A third aspect according to the technology of the present disclosure is the imaging apparatus according to the first or second aspect, in which the plurality of pieces of image data are output from a plurality of the imaging elements.

A fourth aspect according to the technology of the present disclosure is the imaging apparatus according to the third aspect, in which at least one imaging element of the plurality of imaging elements generates a plurality of pieces of image data of different reference levels by performing the imaging accompanying the A/D conversion of different reference levels a plurality of times.

A fifth aspect according to the technology of the present disclosure is the imaging apparatus according to the third aspect, in which an imaging element of a part of the plurality of imaging elements generates a plurality of pieces of first image data by performing imaging accompanying the A/D conversion of different first reference levels, remaining imaging elements of the plurality of imaging elements generate a plurality of pieces of second image data by performing imaging accompanying the A/D conversion of different second reference levels, and the processing portion generates the single image data by combining the plurality of pieces of first image data and the plurality of pieces of second image data.

A sixth aspect according to the technology of the present disclosure is the imaging apparatus according to any one of the third to fifth aspects, in which the processing portion generates the single image data using multiplied signal value image data obtained by multiplying a signal value of the image data obtained by performing the imaging using at least one of the plurality of imaging elements.

A seventh aspect according to the technology of the present disclosure is the imaging apparatus according to any one of the third to sixth aspects, in which any of the plurality of imaging elements supplies the reference level related to each of remaining imaging elements to a corresponding imaging element of the remaining imaging elements.

An eighth aspect according to the technology of the present disclosure is the imaging apparatus according to any one of the first to seventh aspects, in which the processing portion performs processing of combining the plurality of pieces of image data by addition.

A ninth aspect according to the technology of the present disclosure is the imaging apparatus according to any one of the first to eighth aspects, in which a difference in the reference level between the plurality of pieces of image data is less than a minimum voltage level difference necessary for changing individual digital values of the plurality of pieces of image data.

A tenth aspect according to the technology of the present disclosure is the imaging apparatus according to the ninth aspect, in which the difference in the reference level between the plurality of pieces of image data is a value corresponding to a value obtained by dividing the voltage level difference by the number of frames of the plurality of pieces of image data.

An eleventh aspect according to the technology of the present disclosure is the imaging apparatus according to any one of the first to tenth aspects, in which at least a photoelectric conversion element and a storage portion are formed in one chip in the imaging element.

A twelfth aspect according to the technology of the present disclosure is the imaging apparatus according to the eleventh aspect, in which the imaging element is a laminated imaging element in which the photoelectric conversion element is laminated with the storage portion.

A thirteenth aspect according to the technology of the present disclosure is the imaging apparatus according to any one of the first to twelfth aspects, further comprising a control device that performs at least one of a control for displaying an image based on the single image data output by the processing portion on a display portion or a control for storing the single image data output by the processing portion in a storage device.

A fourteenth aspect according to the technology of the present disclosure is an imaging element comprising a photoelectric conversion element incorporated in the imaging element, and a processing portion that is incorporated in the imaging element and generates single image data by combining a plurality of pieces of image data output from the photoelectric conversion element and outputs the generated single image data, in which the plurality of pieces of image data are image data generated by performing imaging accompanying A/D conversion of different reference levels, and the number of bits of the single image data output from the processing portion is greater than the number of bits of each of the plurality of pieces of image data.

A fifteenth aspect according to the technology of the present disclosure is an operation method of an imaging apparatus, the operation method comprising generating single image data by combining a plurality of pieces of image data output from an imaging element, and outputting the generated single image data, in which the plurality of pieces of image data are image data generated by performing imaging accompanying A/D conversion of different reference levels, and the number of bits, in units of pixels, of the single image data output from a processing portion is greater than the number of bits of each of the plurality of pieces of image data in units of pixels.

A sixteenth aspect according to the technology of the present disclosure is an operation method of an imaging element, the operation method comprising generating single image data by combining a plurality of pieces of image data output from a photoelectric conversion element incorporated in the imaging element, and outputting the generated single image data, in which the plurality of pieces of image data are image data generated by performing imaging accompanying A/D conversion of different reference levels, and the number of bits of the output single image data in units of pixels is greater than the number of bits of each of the plurality of pieces of image data in units of pixels.

A seventeenth aspect according to the technology of the present disclosure is a program causing a computer to execute a process comprising generating single image data by combining a plurality of pieces of image data output from an imaging element, and outputting the generated single image data, in which the plurality of pieces of image data are image data generated by performing imaging accompanying A/D conversion of different reference levels, and the number of bits, in units of pixels, of the single image data output from a processing portion is greater than the number of bits of each of the plurality of pieces of image data in units of pixels.

BRIEF DESCRIPTION OF THE DRAWINGS

Exemplary embodiments of the technology of the disclosure will be described in detail based on the following figures, wherein:

FIG. 19 is a schematic image diagram illustrating an example of a part of an image indicated by digital image data obtained by performing the A/D conversion of a few bits using the A/D converter of the imaging element according to the embodiment, and an example of a part of an image indicated by digital image data obtained by performing the A/D conversion of a few tens of bits using the A/D converter of the imaging element;

DETAILED DESCRIPTION

Hereinafter, an example of an embodiment of an imaging apparatus according to the embodiment of the technology of the present disclosure will be described in accordance with the appended drawings.

First, words used in the following description will be described.

The abbreviation CPU stands for "Central Processing Unit". The abbreviation RAM stands for "Random Access Memory". The abbreviation ROM stands for "Read Only Memory". The abbreviation DRAM stands for "Dynamic Random Access Memory". The abbreviation SRAM stands for "Static Random Access Memory". The abbreviation LSI stands for "Large-Scale Integrated circuit". The abbreviation ASIC stands for "Application Specific Integrated Circuit". The abbreviation PLD stands for "Programmable Logic Device". The abbreviation FPGA stands for "Field-Programmable Gate Array". The abbreviation SSD stands for "Solid State Drive". The abbreviation USB stands for "Universal Serial Bus". The abbreviation HDD stands for "Hard Disk Drive". The abbreviation EEPROM stands for "Electrically Erasable and Programmable Read Only Memory". The abbreviation CCD stands for "Charge Coupled Device". The abbreviation CMOS stands for "Complementary Metal Oxide Semiconductor". The abbreviation EL stands for "Electro-Luminescence". The abbreviation A/D stands for "Analog/Digital". The abbreviation I/F stands for "Interface". The abbreviation UI stands for "User Interface". The abbreviation LVDS stands for "Low Voltage Differential Signaling". The abbreviation PCI-e stands for "Peripheral Component Interconnect Express". The abbreviation SATA stands for "Serial Advanced Technology Attachment". The abbreviation SLVS-EC stands for "Scalable Low Signaling with Embedded Clock". The abbreviation MIPI stands for "Mobile Industry Processor Interface". The abbreviation LTE stands for "Long Term Evolution". The abbreviation 5G stands for "5th Generation".

In the description of the present specification, "perpendicular" refers to being perpendicular in a sense of not only being completely perpendicular but also including an error generally allowed in the technical field to which the technology of the present disclosure belongs. In the description of the present specification, "horizontal" refers to being horizontal in a sense of not only being completely horizontal but also including an error generally allowed in the technical field to which the technology of the present disclosure belongs. In the description of the present specification, "vertical" refers to being vertical in a sense of not only being completely vertical but also including an error generally allowed in the technical field to which the technology of the present disclosure belongs. In addition, a numerical value range represented using "to" in the following description means a range including numerical values described before and after "to" as a lower limit value and an upper limit value.

Figure 1:
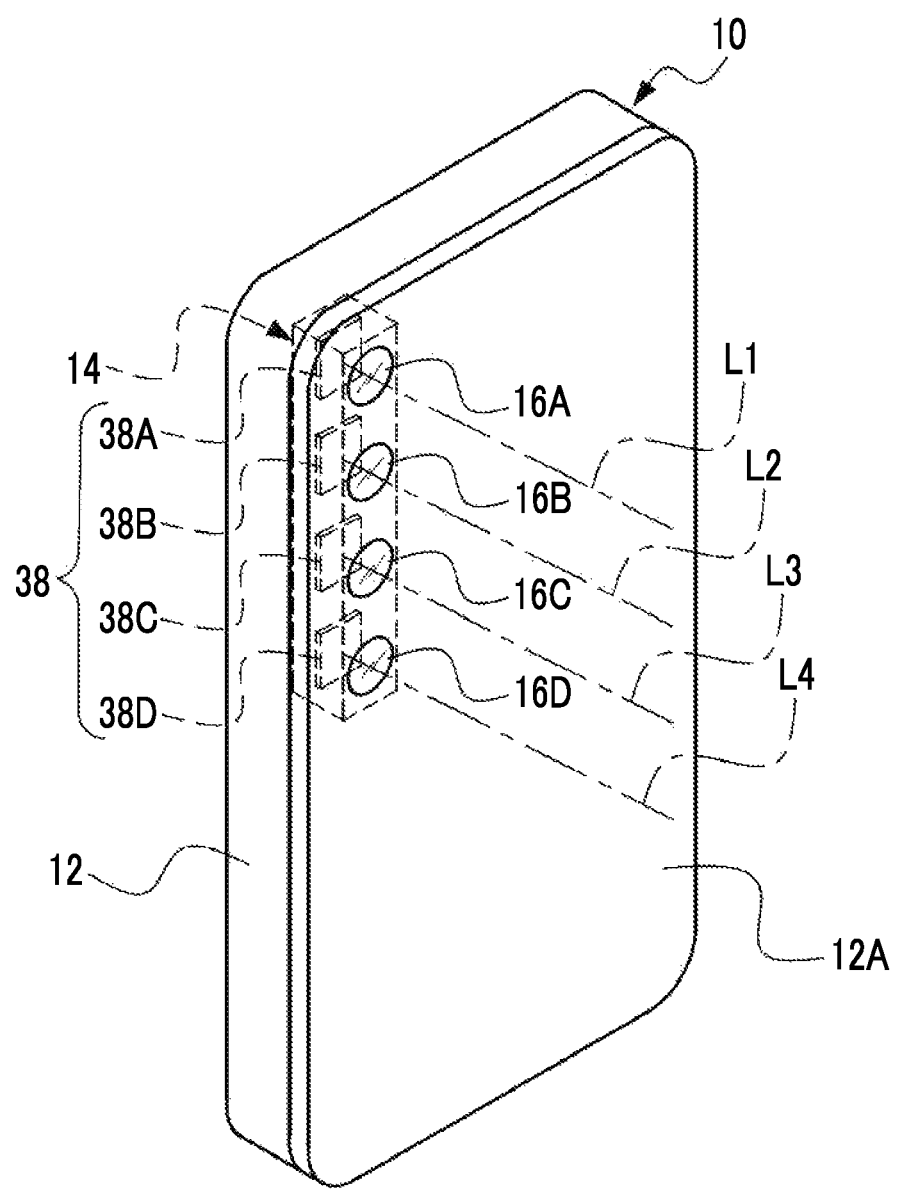
FIG. 1 is a perspective rear view illustrating an example of an exterior on a rear surface side of a smart device according to an embodiment.

As illustrated in FIG. 1 as an example, a smart device 10 comprises a housing 12, and an imaging element unit 14 is accommodated in the housing 12. For example, a smartphone or a tablet terminal that is an electronic apparatus having an imaging function is exemplified as the smart device 10.

The smart device 10 comprises a first imaging lens 16A, a second imaging lens 16B, a third imaging lens 16C, and a fourth imaging lens 16D. In an upper left portion of a rear surface 12A of the housing 12 in a case where the smart device 10 is in a vertically placed state, the first imaging lens 16A, the second imaging lens 16B, the third imaging lens 16C, and the fourth imaging lens 16D are arranged at predetermined intervals (for example, intervals of a few millimeters) in a perpendicular direction and are exposed from the rear surface 12A. A center of the first imaging lens 16A is positioned on an optical axis L1. A center of the second imaging lens 16B is positioned on an optical axis L2. A center of the third imaging lens 16C is positioned on an optical axis L3. A center of the fourth imaging lens 16D is positioned on an optical axis L4.

The imaging element unit 14 comprises a first imaging element 38A, a second imaging element 38B, a third imaging element 38C, and a fourth imaging element 38D. Hereinafter, for convenience of description, the first imaging element 38A, the second imaging element 38B, the third imaging element 38C, and the fourth imaging element 38D will be referred to as an "imaging element 38" unless otherwise necessary to distinguish therebetween.

The first imaging lens 16A is arranged on a front surface side (object side) of the first imaging element 38A. The first imaging lens 16A acquires subject light showing a subject (hereinafter, simply referred to as the "subject light") and forms an image of the acquired subject light on the first imaging element 38A. The second imaging lens 16B is arranged on a front surface side (object side) of the second imaging element 38B. The second imaging lens 16B acquires the subject light and forms the image of the acquired subject light on the second imaging element 38B. The third imaging lens 16C is arranged on a front surface side (object side) of the third imaging element 38C. The third imaging lens 16C acquires the subject light and forms the image of the acquired subject light on the third imaging element 38C. The fourth imaging lens 16D is arranged on a front surface side (object side) of the fourth imaging element 38D. The fourth imaging lens 16D acquires the subject light and forms the image of the acquired subject light on the fourth imaging element 38D.

Figure 2:
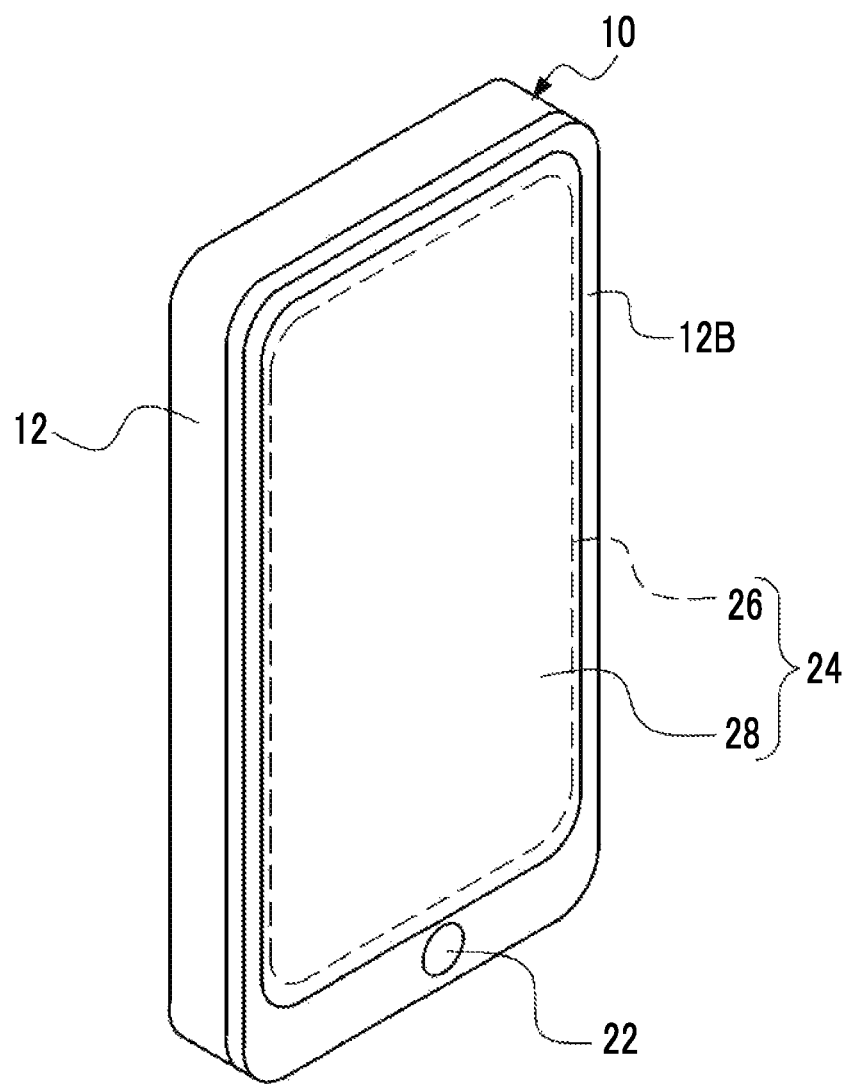
FIG. 2 is a perspective front view illustrating an example of the exterior on a front surface side of the smart device illustrated in FIG. 1.

As illustrated in FIG. 2 as an example, an instruction key 22 and a touch panel display 24 are disposed on a front surface 12B of the housing 12. In a lower portion of the front surface 12B in a case where the smart device 10 is in a vertically placed state, the instruction key 22 is arranged, and the touch panel display 24 is arranged above the instruction key 22. In the present embodiment, while the instruction key 22 is disposed separately from the touch panel display 24, the instruction key 22 may be a virtual instruction key on the touch panel display 24.

The instruction key 22 receives various instructions. For example, the "various instructions" here refer to an instruction to display an unlock reception screen, an instruction to display a menu screen on which various menus can be selected, an instruction to select one or a plurality of menus, an instruction to confirm a selected content, and an instruction to delete the selected content. The unlock reception screen refers to a screen on which a password for unlocking the smart device 10 is received.

Figure 6:
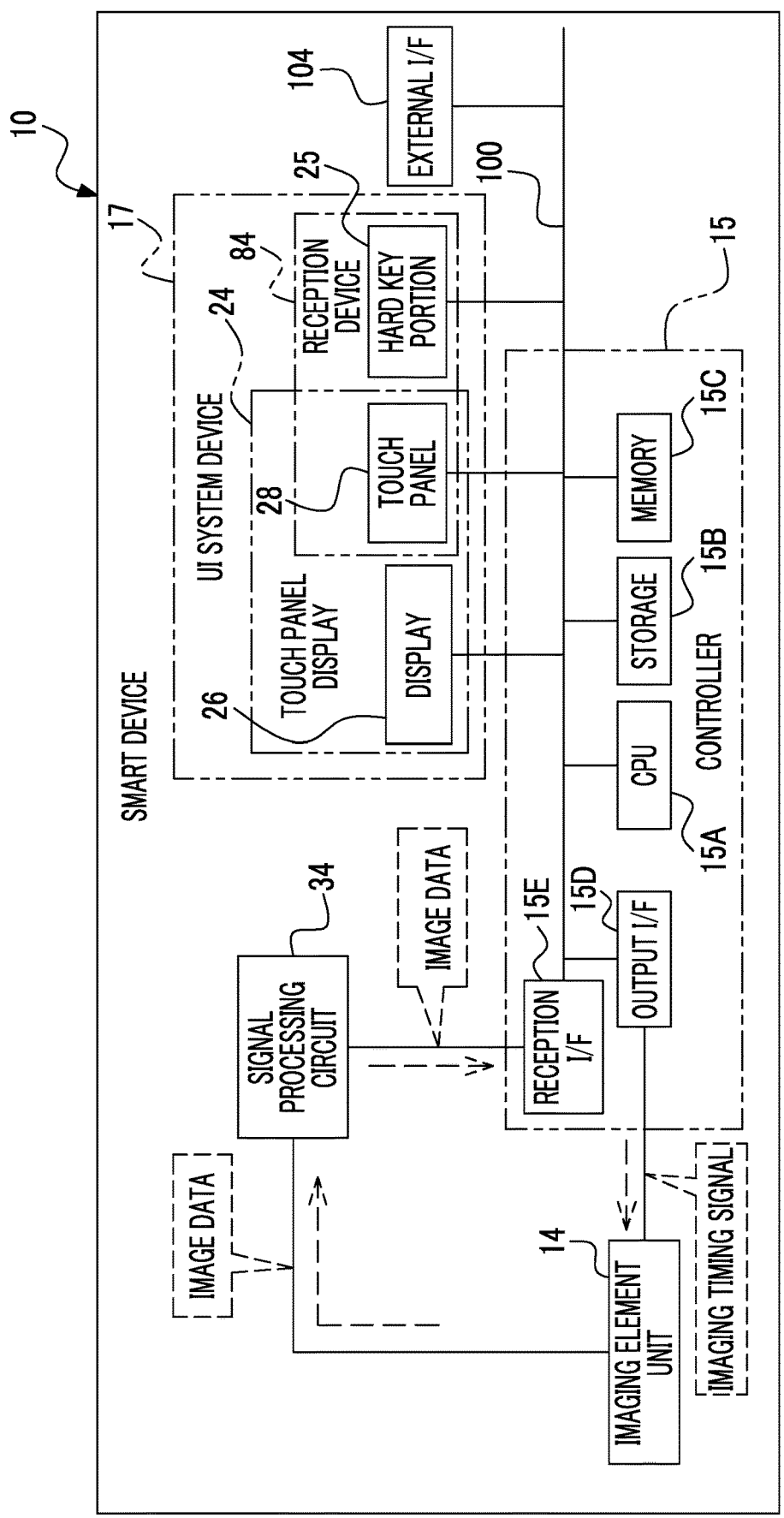
FIG. 6 is a block diagram illustrating an example of a configuration of a controller, a UI system device, and an edge part electric system included in the smart device according to the embodiment.

The touch panel display 24 comprises a display 26 and a touch panel 28 (refer to FIG. 6). A liquid crystal display is exemplified as an example of the display 26. Instead of the liquid crystal display, the display 26 may be a display of other types such as an organic EL display or an inorganic EL display. The display 26 is an example of a "display portion (display)" according to the embodiment of the technology of the present disclosure. In addition, in the present embodiment, while the touch panel 28 is independently disposed, the touch panel 28 may be incorporated in the display 26 (so-called in-cell touch panel).

The display 26 displays images, text information, and the like. The display 26 is used for displaying a live view image obtained by consecutive imaging using the imaging element 38. In addition, the display 26 is used for displaying a still picture image obtained by imaging using the imaging element 38 in a case where an imaging instruction for the still picture image is provided. Furthermore, the display 26 is used for displaying a playback image and displaying a menu screen and the like.

The touch panel 28 is a transmissive touch panel and is overlaid on a surface of a display region of the display 26. The touch panel 28 receives an instruction from a user by detecting a contact of an instruction object such as a finger or a stylus pen.

Figure 3A:
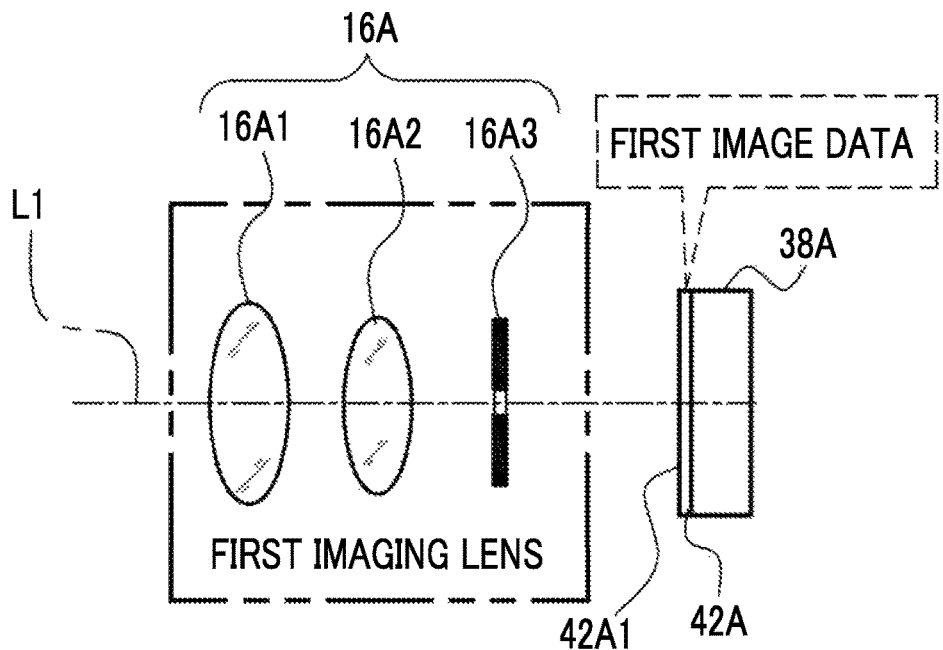
FIG. 3A is a block diagram illustrating an arrangement example of a first imaging lens and a first imaging element included in the smart device according to the embodiment.

As illustrated in FIG. 3A as an example, the first imaging element 38A comprises a photoelectric conversion element 42A having a light receiving surface 42A1. In the present embodiment, the first imaging element 38A is a CMOS image sensor. In addition, here, while the CMOS image sensor is illustrated as the first imaging element 38A, the technology of the present disclosure is not limited thereto. For example, the technology of the present disclosure is also established in a case where the first imaging element 38A is an image sensor of other types such as a CCD image sensor.

The first imaging lens 16A comprises an objective lens 16A1, a focus lens 16A2, and a stop 16A3. The objective lens 16A1, the focus lens 16A2, and the stop 16A3 are arranged in an order of the objective lens 16A1, the focus lens 16A2, and the stop 16A3 along the optical axis L1 from a subject side (object side) to a light receiving surface 42A1 side (image side). The focus lens 16A2 operates by receiving motive power from a driving source (not illustrated) such as a motor. That is, the focus lens 16A2 moves along the optical axis L1 in response to the provided motive power. Here, a fixed stop of which an opening does not change is employed as an example of the stop 16A3. In a case where the stop 16A3 is the fixed stop, exposure adjustment is performed by an electronic shutter of the first imaging element 38A. The stop 16A3 may be a variable stop instead of the fixed stop.

The subject light is transmitted through the first imaging lens 16A, and the image of the subject light is formed on the light receiving surface 42A1. The first imaging element 38A images the subject by receiving the subject light on the light receiving surface 42A1 and photoelectrically converting the received subject light using the photoelectric conversion element 42A. By imaging the subject, the first imaging element 38A generates first image data indicating an image of the subject.

Figure 3B:
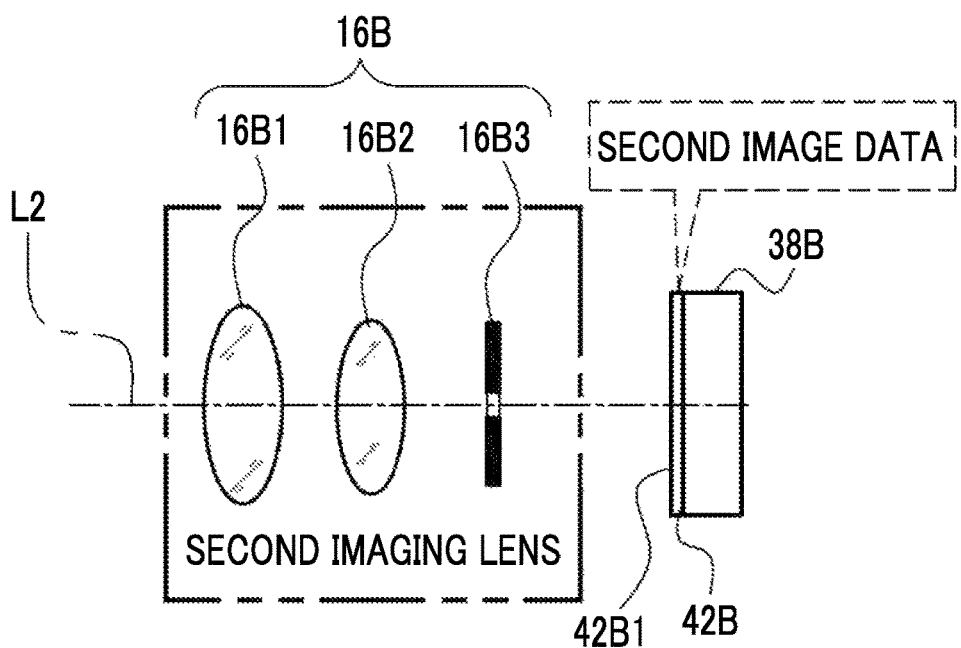
FIG. 3B is a block diagram illustrating an arrangement example of a second imaging lens and a second imaging element included in the smart device according to the embodiment.

As illustrated in FIG. 3B as an example, the second imaging element 38B comprises a photoelectric conversion element 42B having a light receiving surface 42B1. In the present embodiment, the second imaging element 38B is a CMOS image sensor. In addition, here, while the CMOS image sensor is illustrated as the second imaging element 38B, the technology of the present disclosure is not limited thereto. For example, the technology of the present disclosure is also established in a case where the second imaging element 38B is an image sensor of other types such as a CCD image sensor.

The second imaging lens 16B comprises an objective lens 16B1, a focus lens 16B2, and a stop 16B3. The objective lens 16B1, the focus lens 16B2, and the stop 16B3 are arranged in an order of the objective lens 16B1, the focus lens 16B2, and the stop 16B3 along the optical axis L2 from the subject side (object side) to a light receiving surface 42B1 side (image side). The focus lens 16B2 operates by receiving motive power from a driving source (not illustrated) such as a motor. That is, the focus lens 16B2 moves along the optical axis L2 in response to the provided motive power. Here, a fixed stop of which an opening does not change is employed as an example of the stop 16B3. In a case where the stop 16B3 is the fixed stop, the exposure adjustment is performed by an electronic shutter of the second imaging element 38B. The stop 16B3 may be a variable stop instead of the fixed stop.

The subject light is transmitted through the second imaging lens 16B, and the image of the subject light is formed on the light receiving surface 42B1. The second imaging element 38B images the subject by receiving the subject light on the light receiving surface 42B1 and photoelectrically converting the received subject light using the photoelectric conversion element 42B. By imaging the subject, the second imaging element 38B generates second image data indicating the image of the subject.

Figure 3C:
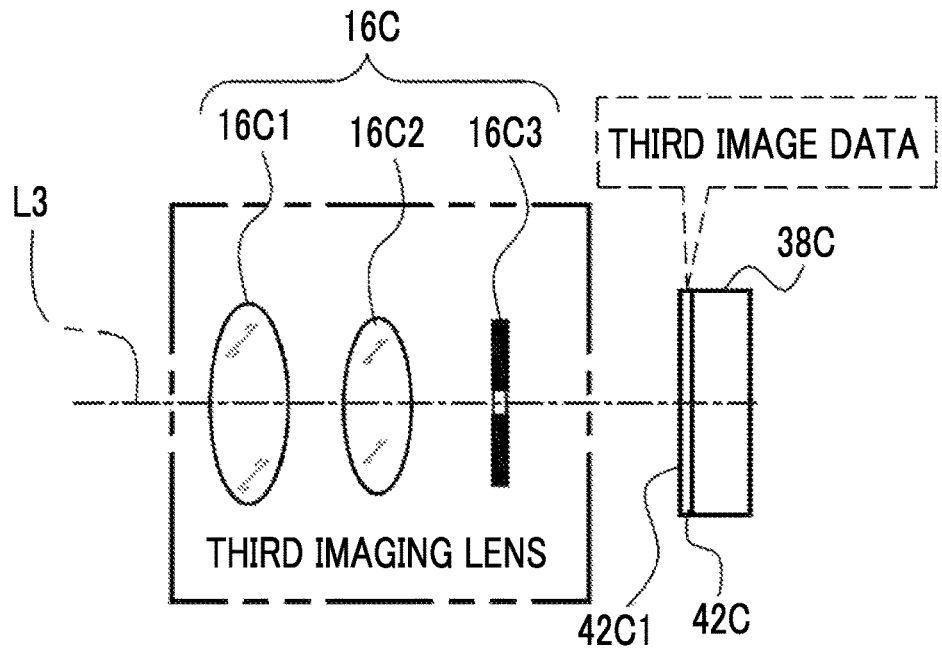
FIG. 3C is a block diagram illustrating an arrangement example of a third imaging lens and a third imaging element included in the smart device according to the embodiment.

As illustrated in FIG. 3C as an example, the third imaging element 38C comprises a photoelectric conversion element 42C having a light receiving surface 42C1. In the present embodiment, the third imaging element 38C is a CMOS image sensor. In addition, here, while the CMOS image sensor is illustrated as the third imaging element 38C, the technology of the present disclosure is not limited thereto. For example, the technology of the present disclosure is also established in a case where the third imaging element 38C is an image sensor of other types such as a CCD image sensor.

The third imaging lens 16C comprises an objective lens 16C1, a focus lens 16C2, and a stop 16C3. The objective lens 16C1, the focus lens 16C2, and the stop 16C3 are arranged in an order of the objective lens 16C1, the focus lens 16C2, and the stop 16C3 along the optical axis L3 from the subject side (object side) to a light receiving surface 42C1 side (image side). The focus lens 16C2 operates by receiving motive power from a driving source (not illustrated) such as a motor. That is, the focus lens 16C2 moves along the optical axis L3 in response to the provided motive power. Here, a fixed stop of which an opening does not change is employed as an example of the stop 16C3. In a case where the stop 16C3 is the fixed stop, the exposure adjustment is performed by an electronic shutter of the third imaging element 38C. The stop 16C3 may be a variable stop instead of the fixed stop.

The subject light is transmitted through the third imaging lens 16C, and the image of the subject light is formed on the light receiving surface 42C1. The third imaging element 38C images the subject by receiving the subject light on the light receiving surface 42C1 and photoelectrically converting the received subject light using the photoelectric conversion element 42C. By imaging the subject, the third imaging element 38C generates third image data indicating the image of the subject.

Figure 3D:
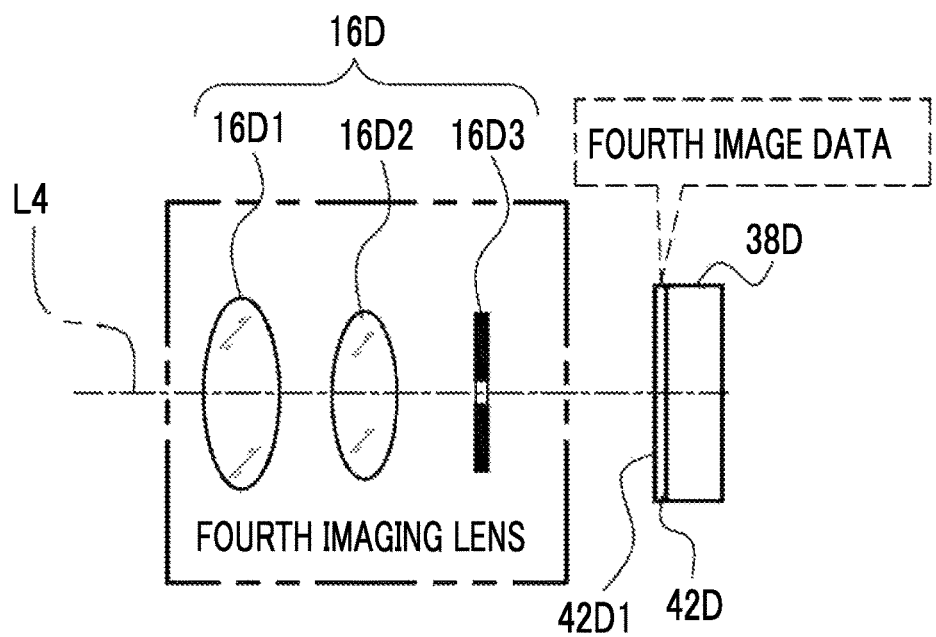
FIG. 3D is a block diagram illustrating an arrangement example of a fourth imaging lens and a fourth imaging element included in the smart device according to the embodiment.

As illustrated in FIG. 3D as an example, the fourth imaging element 38D comprises a photoelectric conversion element 42D having a light receiving surface 42D1. In the present embodiment, the fourth imaging element 38D is a CMOS image sensor. In addition, here, while the CMOS image sensor is illustrated as the fourth imaging element 38D, the technology of the present disclosure is not limited thereto. For example, the technology of the present disclosure is also established in a case where the fourth imaging element 38D is an image sensor of other types such as a CCD image sensor.

The fourth imaging lens 16D comprises an objective lens 16D1, a focus lens 16D2, and a stop 16D3. The objective lens 16D1, the focus lens 16D2, and the stop 16D3 are arranged in an order of the objective lens 16D1, the focus lens 16D2, and the stop 16D3 along the optical axis L4 from the subject side (object side) to a light receiving surface 42D1 side (image side). The focus lens 16D2 operates by receiving motive power from a driving source (not illustrated) such as a motor. That is, the focus lens 16D2 moves along the optical axis L4 in response to the provided motive power. Here, a fixed stop of which an opening does not change is employed as an example of the stop 16D3. In a case where the stop 16D3 is the fixed stop, the exposure adjustment is performed by an electronic shutter of the fourth imaging element 38D. The stop 16D3 may be a variable stop instead of the fixed stop.

The subject light is transmitted through the fourth imaging lens 16D, and the image of the subject light is formed on the light receiving surface 42D1. The fourth imaging element 38D images the subject by receiving the subject light on the light receiving surface 42D1 and photoelectrically converting the received subject light using the photoelectric conversion element 42D. By imaging the subject, the fourth imaging element 38D generates fourth image data indicating the image of the subject.

Hereinafter, for convenience of description, the first image data, the second image data, the third image data, and the fourth image data will be simply referred to as the "image data" unless otherwise necessary to distinguish therebetween. In addition, hereinafter, for convenience of description, the light receiving surfaces 42A1, 42B1, 42C1, and 42D1 will be referred to as the "light receiving surface" without the reference signs unless otherwise necessary to distinguish therebetween. Furthermore, hereinafter, for convenience of description, the photoelectric conversion elements 42A, 42B, 42C, and 42D will be referred to as a "photoelectric conversion element 42" unless otherwise necessary to distinguish therebetween.

Figure 4:
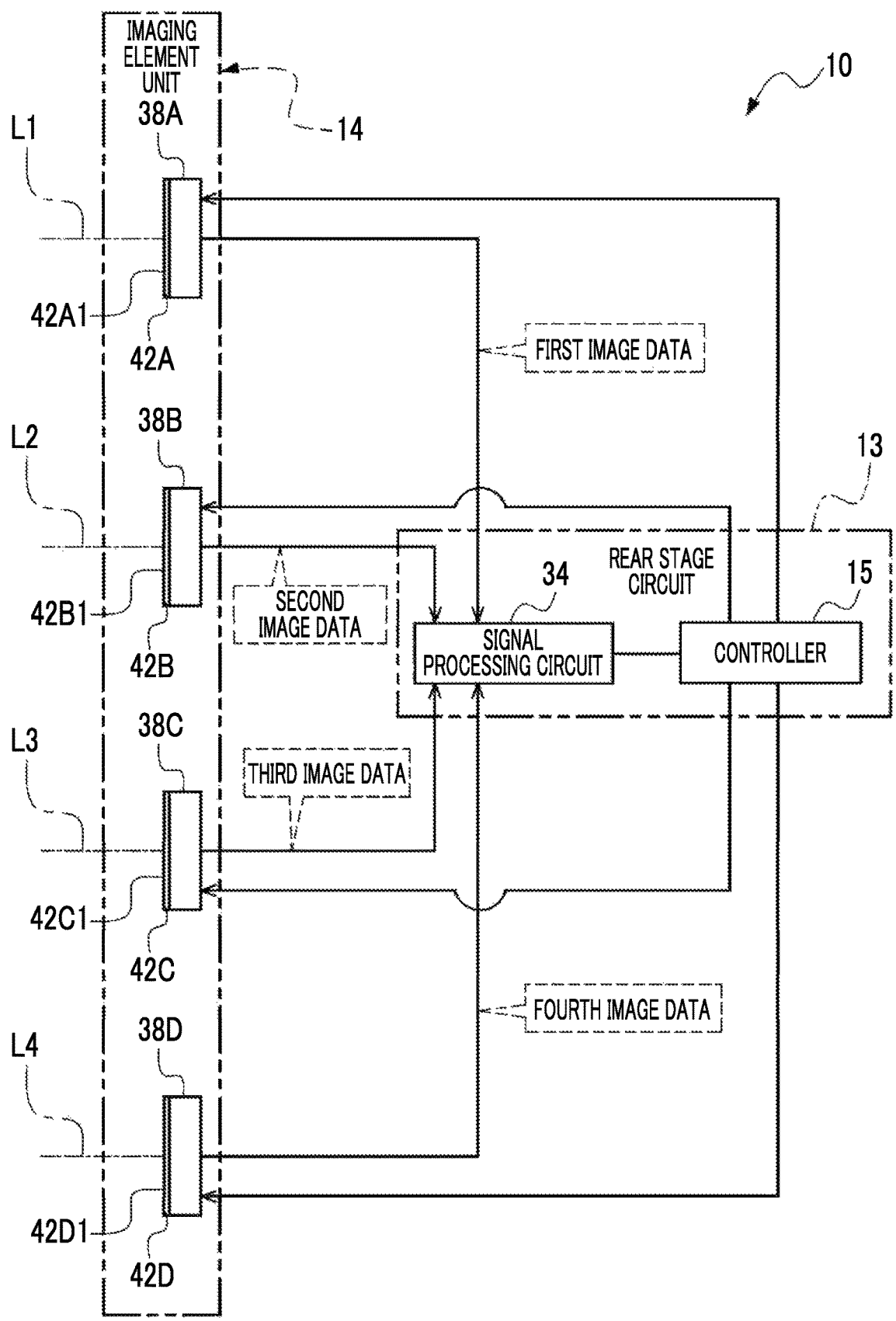
FIG. 4 is a block diagram illustrating a connection example of an imaging element unit and a rear stage circuit included in the smart device according to the embodiment.

As illustrated in FIG. 4 as an example, the smart device 10 comprises a rear stage circuit 13. The rear stage circuit 13 is a circuit positioned on a rear stage of the imaging element unit 14. More specifically, the rear stage circuit 13 is positioned on rear stages of the first imaging element 38A, the second imaging element 38B, the third imaging element 38C, and the fourth imaging element 38D.

The rear stage circuit 13 comprises a controller 15 and a signal processing circuit 34. The controller 15 is connected to an electric system of the smart device 10 and controls the entire electric system of the smart device 10. In the example illustrated in FIG. 4, the controller 15 is connected to each of the signal processing circuit 34, the first imaging element 38A, the second imaging element 38B, the third imaging element 38C, and the fourth imaging element 38D. The first imaging element 38A, the second imaging element 38B, the third imaging element 38C, and the fourth imaging element 38D generate the image data by imaging the subject under control of the controller 15.

Each of the first imaging element 38A, the second imaging element 38B, the third imaging element 38C, and the fourth imaging element 38D is connected to the signal processing circuit 34. The first imaging element 38A outputs the first image data generated by the photoelectric conversion element 42A to the signal processing circuit 34 under control of the controller 15. The second imaging element 38B outputs the second image data generated by the photoelectric conversion element 42B to the signal processing circuit 34 under control of the controller 15. The third imaging element 38C outputs the third image data generated by the photoelectric conversion element 42C to the signal processing circuit 34 under control of the controller 15. The fourth imaging element 38D outputs the fourth image data generated by the photoelectric conversion element 42D to the signal processing circuit 34 under control of the controller 15.

The signal processing circuit 34 performs various types of signal processing on the image data input from the imaging element 38. The various types of signal processing performed by the signal processing circuit 34 include well-known signal processing such as white balance adjustment, sharpness adjustment, gamma correction, color space conversion processing, and color difference correction.

The various types of signal processing performed by the signal processing circuit 34 may be performed in a distributed manner by the signal processing circuit 34 and the imaging element 38. That is, at least a part of the various types of signal processing performed by the signal processing circuit 34 may be performed by a processing circuit 110 (refer to FIG. 7 and FIG. 8) of the imaging element 38.

In the present embodiment, a device including an ASIC and an FPGA is illustrated as the signal processing circuit 34. However, the technology of the present disclosure is not limited thereto. The signal processing circuit 34 may be a device including an ASIC, an FPGA, and/or a PLD. In addition, the signal processing circuit 34 may be a computer including a CPU, a storage, and a memory. The "storage" here refers to a non-volatile storage device such as an SSD or an HDD. The "memory" here refers to a volatile storage device such as a DRAM or an SRAM. The number of CPUs included in the computer may be singular or plural. In addition, a GPU may be used instead of the CPU. In addition, the signal processing circuit 34 may be implemented by a combination of a hardware configuration and a software configuration.

Figure 5:
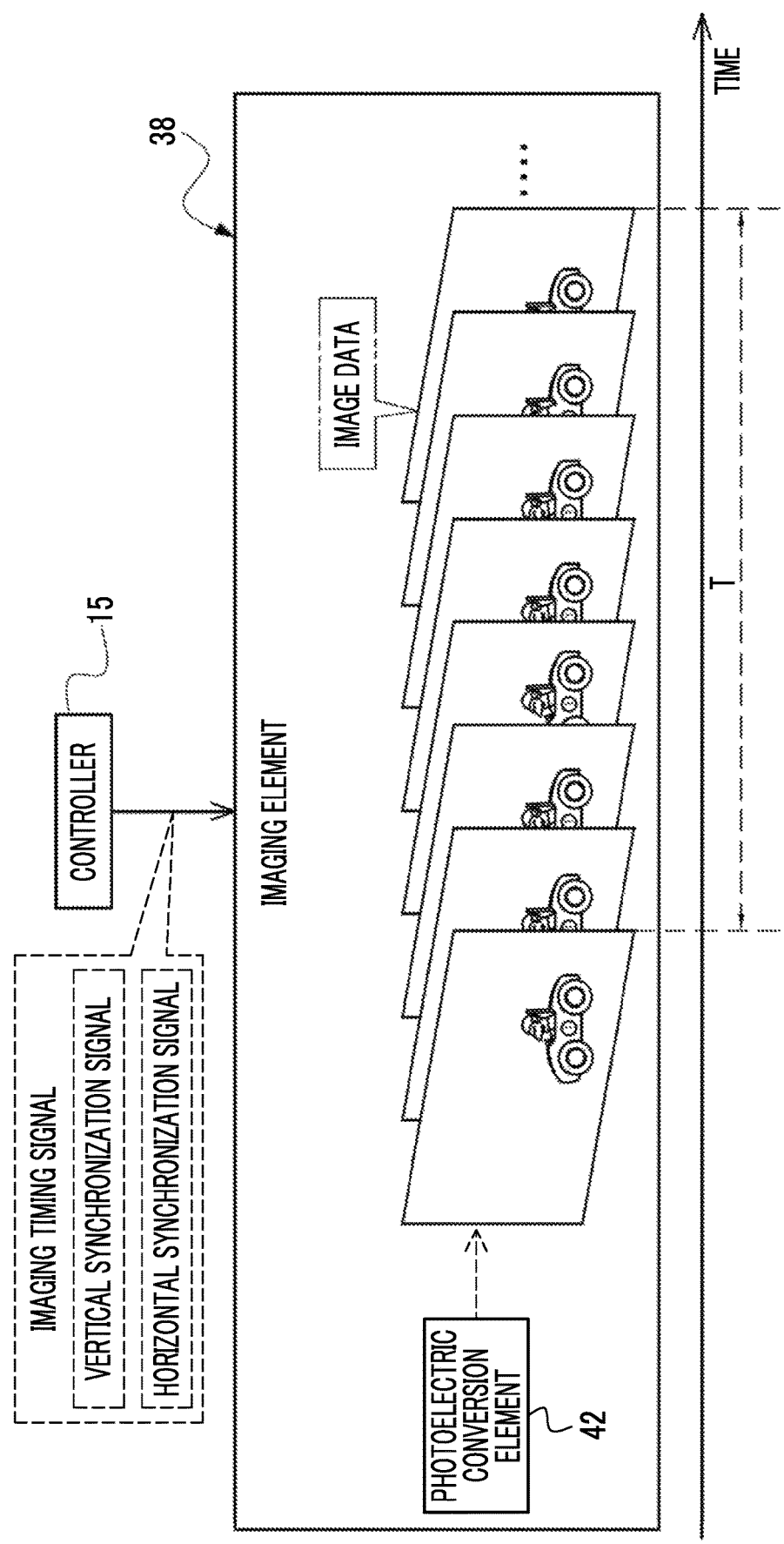
FIG. 5 is a conceptual diagram for describing a frame rate of an imaging element included in an imaging apparatus of the smart device according to the embodiment.

As illustrated in FIG. 5 as an example, an imaging timing signal is input into the imaging element 38 from the controller 15. The imaging timing signal includes a vertical synchronization signal and a horizontal synchronization signal. The vertical synchronization signal is a synchronization signal for defining a start timing of reading of the image data for each frame from the photoelectric conversion element 42. The horizontal synchronization signal is a synchronization signal for defining a start timing of reading of the image data for each horizontal line from the photoelectric conversion element 42. The imaging element 38 reads out the image data from the photoelectric conversion element 42 in accordance with a frame rate decided in accordance with the vertical synchronization signal input from the controller 15.

In the example illustrated in FIG. 5, a frame rate at which eight frames are read out from the photoelectric conversion element 42 within a period T is illustrated as the frame rate of the imaging element 38. Here, 120 fps is exemplified as a specific example of the frame rate. However, the technology of the present disclosure is not limited thereto. A frame rate (for example, 240 fps) exceeding 120 fps may be used, or a frame rate (for example, 60 fps) less than 120 fps may be used.

As illustrated in FIG. 6 as an example, the controller 15 comprises a CPU 15A, a storage 15B, a memory 15C, an output I/F 15D, and a reception I/F 15E. The CPU 15A, the storage 15B, the memory 15C, the output I/F 15D, and the reception I/F 15E are connected through a busline 100. In the example illustrated in FIG. 4, for convenience of illustration, one busline is illustrated as the busline 100. However, the busline 100 is configured with a serial bus or is configured to include a data bus, an address bus, a control bus, and the like.

The storage 15B stores various parameters and various programs. The storage 15B is a non-volatile storage device. Here, an EEPROM is employed as an example of the storage 15B. However, the technology of the present disclosure is not limited thereto. A mask ROM, an HDD, an SSD, or the like may be used. The memory 15C is a storage device.

Various types of information are temporarily stored in the memory 15C. The memory 15C is used as a work memory by the CPU 15A. Here, a DRAM is employed as an example of the memory 15C. However, the technology of the present disclosure is not limited thereto. A storage device of other types such as an SRAM may be used. The CPU 15A is an example of a "control device" according to the embodiment of the technology of the present disclosure. The storage 15B is an example of a "storage device" according to the embodiment of the technology of the present disclosure.

The storage 15B stores various programs. The CPU 15A reads out a necessary program from the storage 15B and executes the read program on the memory 15C. The CPU 15A controls the entire smart device 10 in accordance with the program executed on the memory 15C.

The output I/F 15D is connected to the imaging element unit 14. The CPU 15A controls the imaging element unit 14 through the output I/F 15D. For example, the CPU 15A controls a timing of imaging performed by the imaging element unit 14 by supplying the imaging timing signal for defining the timing of imaging to the imaging element unit 14 through the output I/F 15D.

The reception I/F 15E is connected to the signal processing circuit 34. The CPU 15A exchanges various types of information with the signal processing circuit 34 through the reception I/F 15E.

The image data is input into the signal processing circuit 34 from the imaging element unit 14. The signal processing circuit 34 performs various types of signal processing on the image data input from the imaging element unit 14. The signal processing circuit 34 outputs the image data on which the various types of signal processing are performed, to the reception I/F 15E. The reception I/F 15E receives the image data from the signal processing circuit 34 and transfers the received image data to the CPU 15A.

An external I/F 104 is connected to the busline 100. The external I/F 104 is a communication device configured with a circuit. Here, while the device configured with the circuit is employed as the external I/F 104, the device is merely an example. The external I/F 104 may be a device including an ASIC, an FPGA, and/or a PLD. In addition, the external I/F 104 may be implemented by a combination of a hardware configuration and a software configuration.

A USB interface is an example of the external I/F 104. An external apparatus (not illustrated) such as a memory card controller, another smart device, a personal computer, a server, a USB memory, and/or a memory card can be connected to the external I/F 104. The external I/F 104 controls exchange of various types of information between the CPU 15A and the external apparatus. The external apparatus directly or indirectly connected to the external I/F 104, that is, the external apparatus such as the smart device, the personal computer, the server, the USB memory, and/or the memory card is an example of the "storage device" according to the embodiment of the technology of the present disclosure.

A UI system device 17 comprises the touch panel display 24 and a reception device 84. The display 26 and the touch panel 28 are connected to the busline 100. Accordingly, the CPU 15A displays various types of information on the display 26 and operates in accordance with various instructions received by the touch panel 28. The reception device 84 comprises a hard key portion 25. The hard key portion 25 is at least one hard key including the instruction key 22 (refer to FIG. 2). The hard key portion 25 is connected to the busline 100, and the CPU 15A acquires an instruction received by the hard key portion 25 and operates in accordance with the acquired instruction. The hard key portion 25 may be configured to be connected to the external I/F 104.

The smart device 10 has a communication function such as LTE, 5G, a wireless LAN, and/or Bluetooth (registered trademark).

Figure 7:
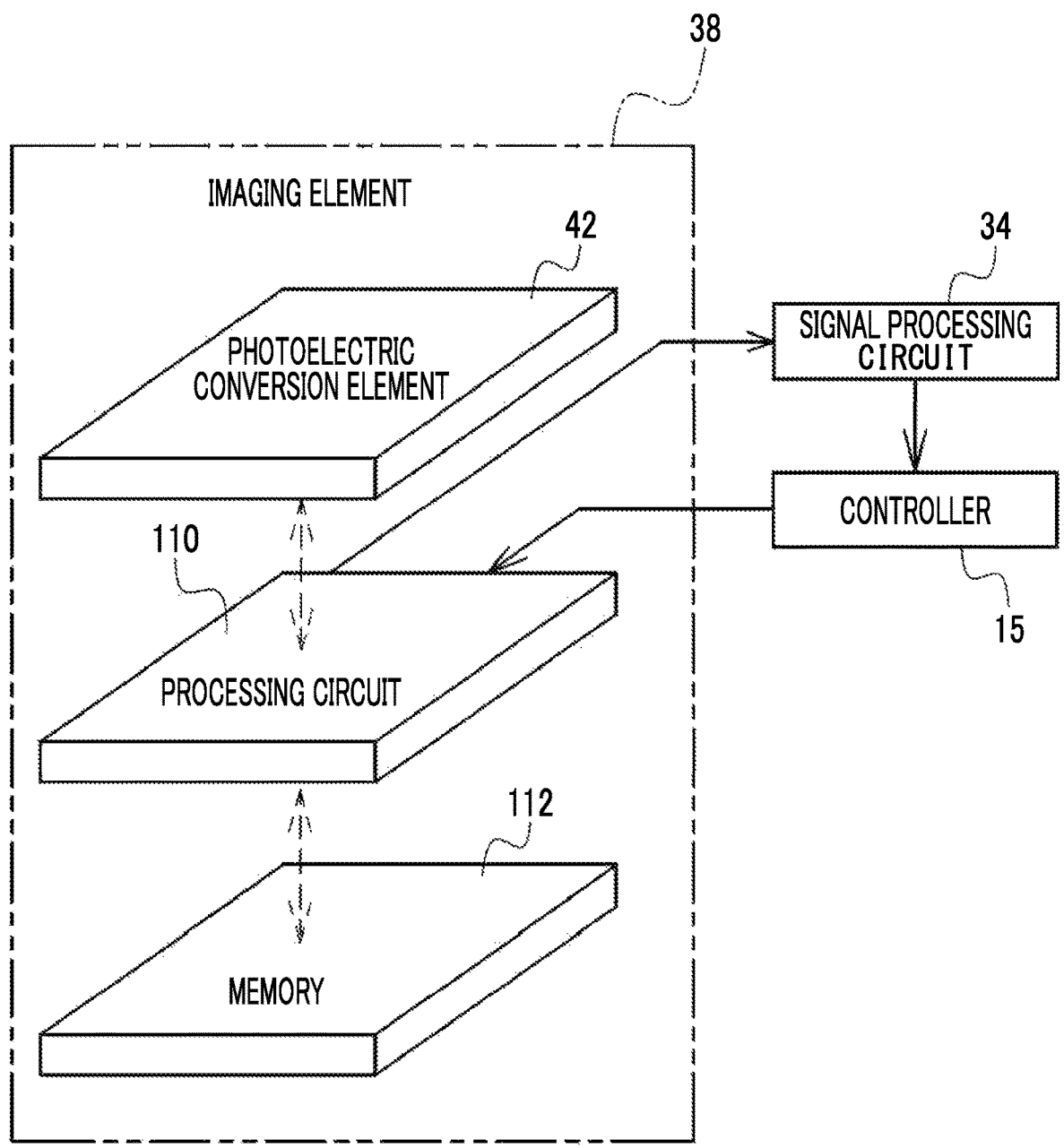
FIG. 7 is a conceptual diagram illustrating an example of a laminated structure of the imaging element according to the embodiment.

As illustrated in FIG. 7 as an example, the imaging element 38 incorporates the photoelectric conversion element 42, the processing circuit 110, and a memory 112. The imaging element 38 is an imaging element in which the photoelectric conversion element 42, the processing circuit 110, and the memory 112 are formed in one chip. That is, the photoelectric conversion element 42, the processing circuit 110, and the memory 112 are formed in one package. In the imaging element 38, the photoelectric conversion element 42 is laminated with the processing circuit 110 and the memory 112. Specifically, the photoelectric conversion element 42 and the processing circuit 110 are electrically connected to each other by a bump (not illustrated) of copper or the like having conductivity. The processing circuit 110 and the memory 112 are also electrically connected to each other by a bump (not illustrated) of copper or the like having conductivity. While a three-layer structure of the photoelectric conversion element 42, the processing circuit 110, and the memory 112 is illustrated here, the technology of the present disclosure is not limited thereto. A two-layer structure of the photoelectric conversion element 42 and a memory layer in which the processing circuit 110 and the memory 112 are formed in one layer may be used.

For example, the processing circuit 110 is an LSI. The memory 112 is a memory of which a writing timing and a reading timing are different. Here, a DRAM is employed as an example of the memory 112.

The processing circuit 110 is a device including an ASIC and an FPGA and controls the entire imaging element 38 in accordance with an instruction of the controller 15. While an example of implementing the processing circuit 110 by the device including the ASIC and the FPGA is exemplified here, the technology of the present disclosure is not limited thereto. For example, a device including an ASIC, an FPGA, and/or a PLD may be used. In addition, a computer including a CPU, a storage such as an EEPROM that is a non-volatile storage device, and a memory such as a RAM that is a volatile storage device may be employed as the processing circuit 110. The number of CPUs included in the computer may be singular or plural. A GPU may be used instead of the CPU. In addition, the processing circuit 110 may be implemented by a combination of a hardware configuration and a software configuration.

The photoelectric conversion element 42 includes a plurality of photodiodes arranged in a matrix form. Photodiodes of "4896×3265" pixels are exemplified as an example of the plurality of photodiodes.

Color filters are arranged in each photodiode included in the photoelectric conversion element 42. The color filters include a G filter corresponding to green (G) that most contributes to obtaining a brightness signal, an R filter corresponding to red (R), and a B filter corresponding to blue (B).

The photoelectric conversion element 42 includes R pixels, G pixels, and B pixels. The R pixels are pixels corresponding to photodiodes in which the R filter is arranged. The G pixels are pixels corresponding to photodiodes in which the G filter is arranged. The B pixels are pixels corresponding to photodiodes in which the B filter is arranged. The R pixels, the G pixels, and the B pixels are arranged with predetermined periodicity in each of a row direction (horizontal direction) and a column direction (vertical direction). In the present embodiment, the R pixels, the G pixels, and the B pixels are arranged with periodicity corresponding to X-Trans (registered trademark) arrangement. While the X-Trans arrangement is illustrated here, the technology of the present disclosure is not limited thereto. Arrangement of the R pixels, the G pixels, and the B pixels may be Bayer arrangement or honeycomb arrangement.

The imaging element 38 has a so-called electronic shutter function and controls an electric charge accumulation time period of each photodiode in the photoelectric conversion element 42 by performing the electronic shutter function under control of the controller 15. The electric charge accumulation time period refers to a so-called shutter speed.

Imaging by the imaging element 38 is implemented by performing the electronic shutter function using a rolling shutter method. While the rolling shutter method is illustrated here, the technology of the present disclosure is not limited thereto. A global shutter method may be applied instead of the rolling shutter method.

The memory 112 is an example of a "storage portion (memory)" according to the embodiment of the technology of the present disclosure. In the present embodiment, while the DRAM is employed as the memory 112, the technology of the present disclosure is also established in a case where the memory 112 is a memory of other types. In addition, the imaging element 38 is an example of a "laminated imaging element" according to the embodiment of the technology of the present disclosure.

Figure 8:
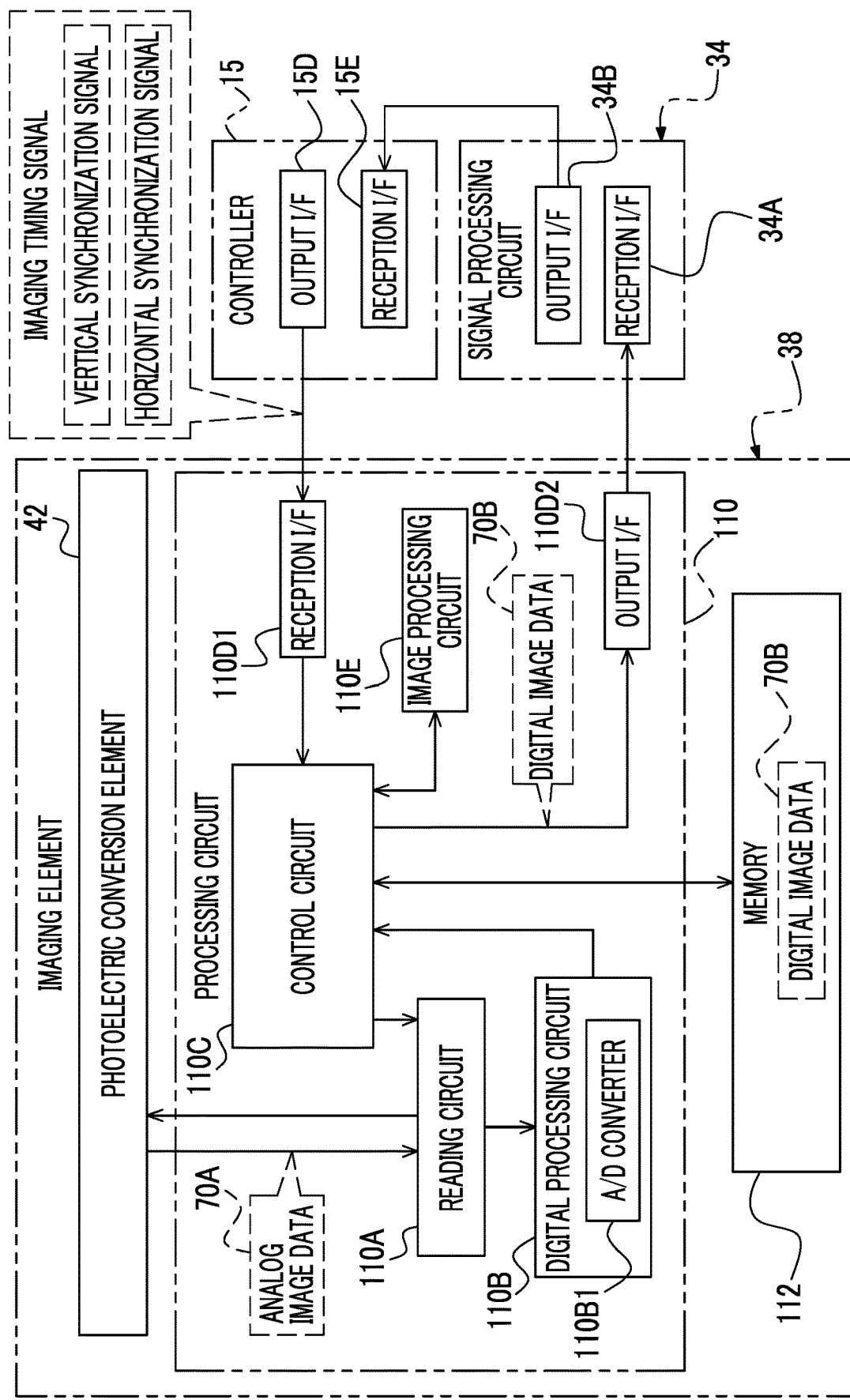
FIG. 8 is a block diagram illustrating an example of a configuration of the imaging element and an edge part according to the embodiment.

As illustrated in FIG. 8 as an example, the processing circuit 110 comprises a reception I/F 110D1 and an output I/F 110D2. The output I/F 15D of the controller 15 is connected to the reception I/F 110D1 of the processing circuit 110 and outputs the imaging timing signal to the reception I/F 110D1. The reception I/F 110D1 receives the imaging timing signal output from the output I/F 15D.

The signal processing circuit 34 comprises a reception I/F 34A and an output I/F 34B. The reception I/F 34A is connected to the output I/F 110D2 of the imaging element 38. The output I/F 110D2 of the processing circuit 110 outputs various types of information such as the image data (hereinafter, simply referred to as the "various types of information") to the reception I/F 34A of the signal processing circuit 34. The reception I/F 34A receives the various types of information output from the output I/F 110D2. The signal processing circuit 34 performs signal processing as necessary on the various types of information received by the reception I/F 34A. The output I/F 34B is connected to the reception I/F 15E of the controller 15 and outputs the various types of information to the reception I/F 15E of the controller 15. The reception I/F 15E receives the various types of information output from the output I/F 34B.

Hereinafter, for convenience of description, the output I/F 110D2 of the first imaging element 38A will be referred to as an "output I/F 110D2a" (refer to FIG. 11). The output I/F 110D2 of the second imaging element 38B will be referred to as an "output I/F 110D2b" (refer to FIG. 11). The output I/F 110D2 of the third imaging element 38C will be referred to as an "output I/F 110D2c" (refer to FIG. 11). The output I/F 110D2 of the fourth imaging element 38D will be referred to as an "output I/F 110D2d" (refer to FIG. 11). The output I/Fs 110D2a, 110D2b, 110D2c, and 110D2d will be referred to as the "output I/F 110D2" unless otherwise necessary to distinguish therebetween (refer to FIG. 8).

Figure 11:
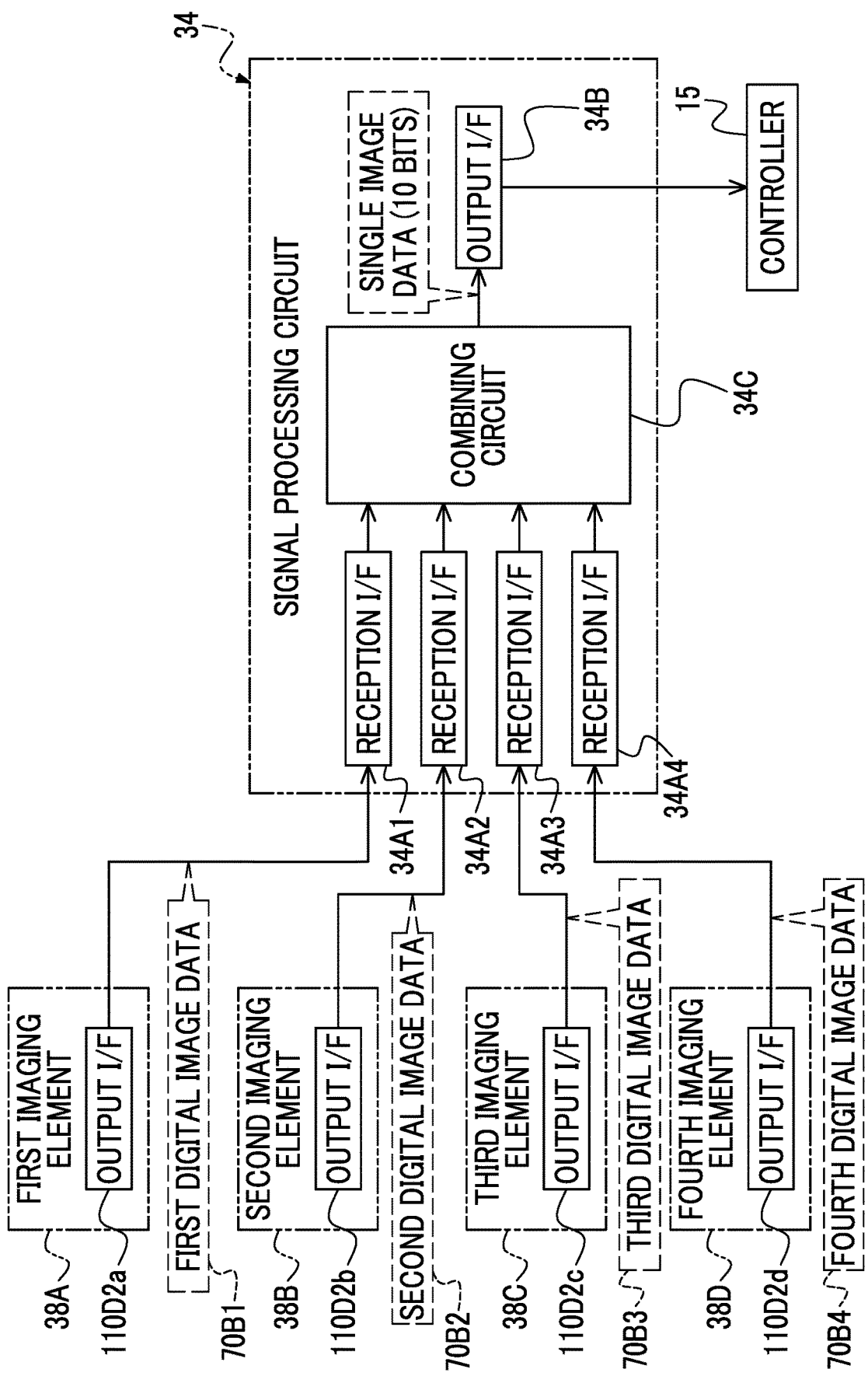
FIG. 11 is a block diagram illustrating an example of a configuration of the first imaging element, the second imaging element, the third imaging element, the fourth imaging element, and a signal processing circuit according to the embodiment.

In addition, the reception I/F 34A of the signal processing circuit 34 is broadly divided into reception I/Fs 34A1, 34A2, 34A3, and 34A4 (refer to FIG. 11). The reception I/F 34A1 is connected to the output I/F 110D2a (refer to FIG. 11). The reception I/F 34A2 is connected to the output I/F 110D2b (refer to FIG. 11). The reception I/F 34A3 is connected to the output I/F 110D2c (refer to FIG. 11). The reception I/F 34A4 is connected to the output I/F 110D2d (refer to FIG. 11).

As illustrated in FIG. 8 as an example, in the imaging element 38, the processing circuit 110 comprises, in addition to the reception I/F 110D1 and the output I/F 110D2, a reading circuit 110A, a digital processing circuit 110B, a control circuit 110C, and an image processing circuit 110E.

The reading circuit 110A is connected to each of the photoelectric conversion element 42, the digital processing circuit 110B, and the control circuit 110C. The digital processing circuit 110B is connected to the control circuit 110C. The control circuit 110C is connected to each of the memory 112, the reception I/F 110D1, the output I/F 110D2, and the image processing circuit 110E.

As illustrated in FIG. 8 as an example, the image data is broadly divided into analog image data 70A and digital image data 70B. Hereinafter, for convenience of description, the analog image data 70A and the digital image data 70B will be referred to as the "image data" without the reference signs unless otherwise necessary to distinguish therebetween.

In addition, hereinafter, for convenience of description, the digital image data 70B obtained by performing imaging using the first imaging element 38A will be referred to as "first digital image data 70B1" (refer to FIG. 11). The digital image data 70B obtained by performing imaging using the second imaging element 38B will be referred to as "second digital image data 70B2" (refer to FIG. 11). The digital image data 70B obtained by performing imaging using the third imaging element 38C will be referred to as "third digital image data 70B3" (refer to FIG. 11). The digital image data 70B obtained by performing imaging using the fourth imaging element 38D will be referred to as "fourth digital image data 70B4" (refer to FIG. 11). The first digital image data 70B1, the second digital image data 70B2, the third digital image data 70B3, and the fourth digital image data 70B4 will be referred to as "digital image data 70B" unless otherwise necessary to distinguish therebetween.

Each of the reception I/F 110D1 and the output I/F 110D2 of the processing circuit 110 is a communication device including an FPGA. In addition, each of the output I/F 15D and the reception I/F 15E of the controller 15 is a communication device including an FPGA. Furthermore, each of the reception I/F 34A and the output I/F 34B of the signal processing circuit 34 is a communication device including an FPGA.

The reception I/F 110D1 of the processing circuit 110 and the output I/F 15D of the controller 15 are connected in accordance with a PCI-e connection standard. In addition, the output I/F 110D2 of the processing circuit 110 and the reception I/F 34A of the signal processing circuit 34 are connected in accordance with the PCI-e connection standard. Furthermore, the output I/F 34B of the signal processing circuit 34 and the reception I/F 15E of the controller 15 are connected in accordance with the PCI-e connection standard. Hereinafter, the reception I/F 110D1, the output I/F 110D2, the reception I/F 34A, the output I/F 34B, the reception I/F 15E, and the output I/F 15D will be referred to as a "communication I/F" without the reference signs unless otherwise necessary to distinguish therebetween.

Here, a communication device configured with a circuit (an ASIC, an FPGA, and/or a PLD or the like) is employed as the communication I/F. However, the communication device is merely an example. The communication I/F may be a computer including a CPU, a storage such as an EEPROM that is a non-volatile storage device, and a memory such as a RAM that is a volatile storage device. In this case, the number of CPUs included in the computer may be singular or plural. A GPU may be used instead of the CPU. In addition, the communication I/F may be implemented by a combination of a hardware configuration and a software configuration.

The reception I/F 110D1 receives the imaging timing signal output from the output I/F 15D of the controller 15 and transfers the received imaging timing signal to the control circuit 110C.

The reading circuit 110A controls the photoelectric conversion element 42 and reads out the analog image data 70A from the photoelectric conversion element 42 under control of the control circuit 110C. Reading of the analog image data 70A from the photoelectric conversion element 42 is performed in accordance with the imaging timing signal which is input into the processing circuit 110 from the controller 15.

Specifically, first, the reception I/F 110D1 receives the imaging timing signal from the controller 15 and transfers the received imaging timing signal to the control circuit 110C. Next, the control circuit 110C transfers the imaging timing signal transferred from the reception I/F 110D1 to the reading circuit 110A. That is, the vertical synchronization signal and the horizontal synchronization signal are transferred to the reading circuit 110A. The reading circuit 110A starts reading out the analog image data 70A in units of frames from the photoelectric conversion element 42 in accordance with the vertical synchronization signal transferred from the control circuit 110C. In addition, the reading circuit 110A starts reading out the analog image data 70A in units of horizontal lines in accordance with the horizontal synchronization signal transferred from the control circuit 110C.

The reading circuit 110A performs analog signal processing on the analog image data 70A read out from the photoelectric conversion element 42. The analog signal processing includes well-known processing such as noise cancelation processing and analog gain processing. The noise cancelation processing is processing of canceling a noise caused by variations in characteristics between pixels included in the photoelectric conversion element 42. The analog gain processing is processing of applying a gain to the analog image data 70A. In addition, the reading circuit 110A performs correlative double sampling on the analog image data 70A. After the correlative double sampling is performed on the analog image data 70A by the reading circuit 110A, the analog image data 70A is output to the digital processing circuit 110B.

The digital processing circuit 110B comprises an A/D converter 110B1. The A/D converter 110B1 performs A/D conversion of 8 bits in units of pixels on the analog image data 70A. Hereinafter, for convenience of description, the A/D converter 110B1 of the first imaging element 38A will be referred to as an "A/D converter 110B1a" (refer to FIG. 10). The A/D converter 110B1 of the second imaging element 38B will be referred to as an "A/D converter 110B1b" (refer to FIG. 10). The A/D converter 110B1 of the third imaging element 38C will be referred to as an "A/D converter 110B1c" (refer to FIG. 10). The A/D converter 110B1 of the fourth imaging element 38D will be referred to as an "A/D converter 110B1d" (refer to FIG. 10). The A/D converters 110B1a, 110B1b, 110B1c, and 110B1d will be referred to as the "A/D converter 110B1" unless otherwise necessary to distinguish therebetween (refer to FIG. 8).

The digital processing circuit 110B performs digital signal processing on the analog image data 70A input from the reading circuit 110A. For example, the digital signal processing includes the correlative double sampling, the A/D conversion performed by the A/D converter 110B1, and digital gain processing.

The A/D converter 110B1 performs the A/D conversion on the analog image data 70A input from the reading circuit 110A. Accordingly, the analog image data 70A is digitized, and the digital image data 70B is obtained as RAW data. The digital gain processing is performed on the digital image data 70B by the digital processing circuit 110B. The digital gain processing refers to processing of applying a gain to the digital image data 70B. The digital image data 70B obtained by performing the digital signal processing in such a manner is output to the control circuit 110C by the digital processing circuit 110B.

The control circuit 110C outputs the digital image data 70B input from the digital processing circuit 110B to the image processing circuit 110E. The image processing circuit 110E performs image processing on the digital image data 70B input from the control circuit 110C and outputs the digital image data 70B after the image processing to the control circuit 110C. For example, demosaicing and/or digital thinning processing is exemplified as the "image processing" here.

The demosaicing is processing of calculating every color information for each pixel from a mosaic image corresponding to arrangement of the color filters. For example, in a case where the imaging element 38 is an imaging element to which color filters of three colors of R, G, and B are applied, color information on all of R, G, and B is calculated from a mosaic image of R, G, and B for each pixel. The digital thinning processing is processing of thinning out the pixels included in the image data in units of lines. For example, the units of lines refer to units of horizontal lines and/or units of vertical lines.

The memory 112 is a memory that can store the digital image data of a plurality of frames. The memory 112 has a storage region in units of pixels. The digital image data 70B is stored in a corresponding storage region of the memory 112 in units of pixels by the control circuit 110C. That is, the control circuit 110C stores the digital image data 70B input from the image processing circuit 110E in the memory 112. In addition, the control circuit 110C can randomly access the memory 112 and acquires the digital image data 70B from the memory 112 in accordance with the frame rate. The control circuit 110C outputs the digital image data 70B acquired from the memory 112 to the signal processing circuit 34 using the output I/F 110D2.

In the signal processing circuit 34, the digital image data 70B input from the output I/F 110D2 is received by the reception I/F 34A, and the various types of signal processing are performed on the received digital image data 70B.

Figure 9:
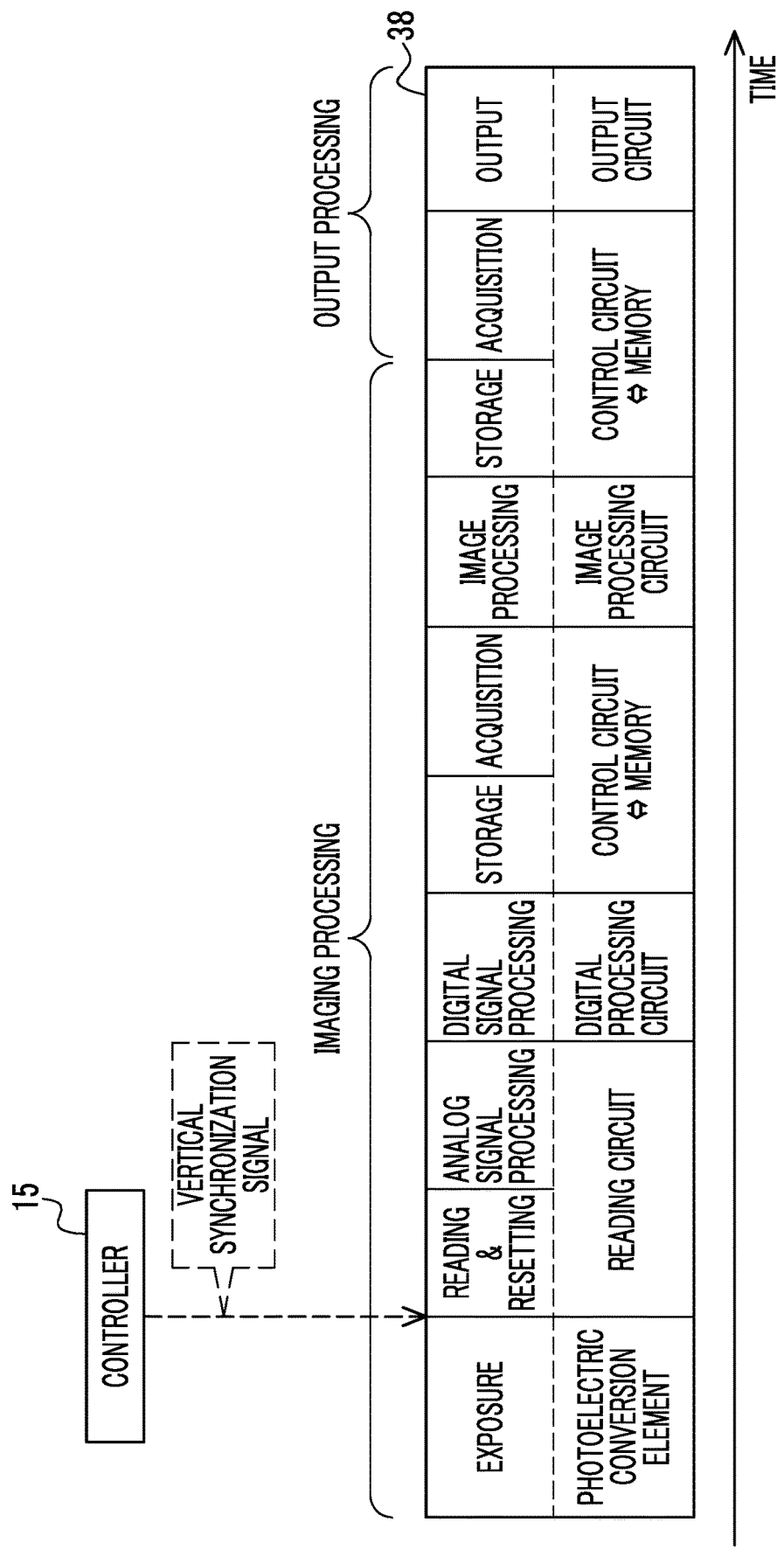
FIG. 9 is a transition diagram illustrating an example of contents of imaging processing and output processing performed by the imaging element according to the embodiment.

As illustrated in FIG. 9 as an example, in the imaging element 38, processing including imaging processing and output processing is performed.

In the imaging processing, exposure, reading of the analog image data 70A, resetting of the photoelectric conversion element 42, the analog signal processing, the digital signal processing, first-time storage, first-time acquisition, the image processing, and second-time storage are performed in this order.

The exposure is performed by the photoelectric conversion element 42. Reading of the analog image data 70A, resetting of the photoelectric conversion element 42, and the analog signal processing are performed by the reading circuit 110A. A period in which the exposure is performed by the photoelectric conversion element 42 is a period in which reading of the analog image data 70A and resetting of the photoelectric conversion element 42 are not performed.

The digital signal processing is performed by the digital processing circuit 110B. The first-time storage refers to storage of the digital image data 70B obtained by performing the digital signal processing in the memory 112. The first-time acquisition refers to acquisition of the digital image data 70B from the memory 112 for the first time. The first-time storage and the first-time acquisition are performed by the control circuit 110C. The image processing circuit 110E performs the image processing on the digital image data 70B acquired by the control circuit 110C. The second-time storage refers to storage, in the memory 112, of the digital image data 70B on which the image processing is performed. The second-time storage is performed by the control circuit 110C.

In the output processing, second-time acquisition and output of the digital image data 70B are performed. The second-time acquisition refers to acquisition of the digital image data 70B after the image processing from the memory 112. The second-time acquisition is performed by the control circuit 110C. Output of the digital image data 70B refers to output of the digital image data 70B after the image processing, which is acquired from the memory 112 by the control circuit 110C, to the signal processing circuit 34 by the output I/F 110D2.

Figure 10:
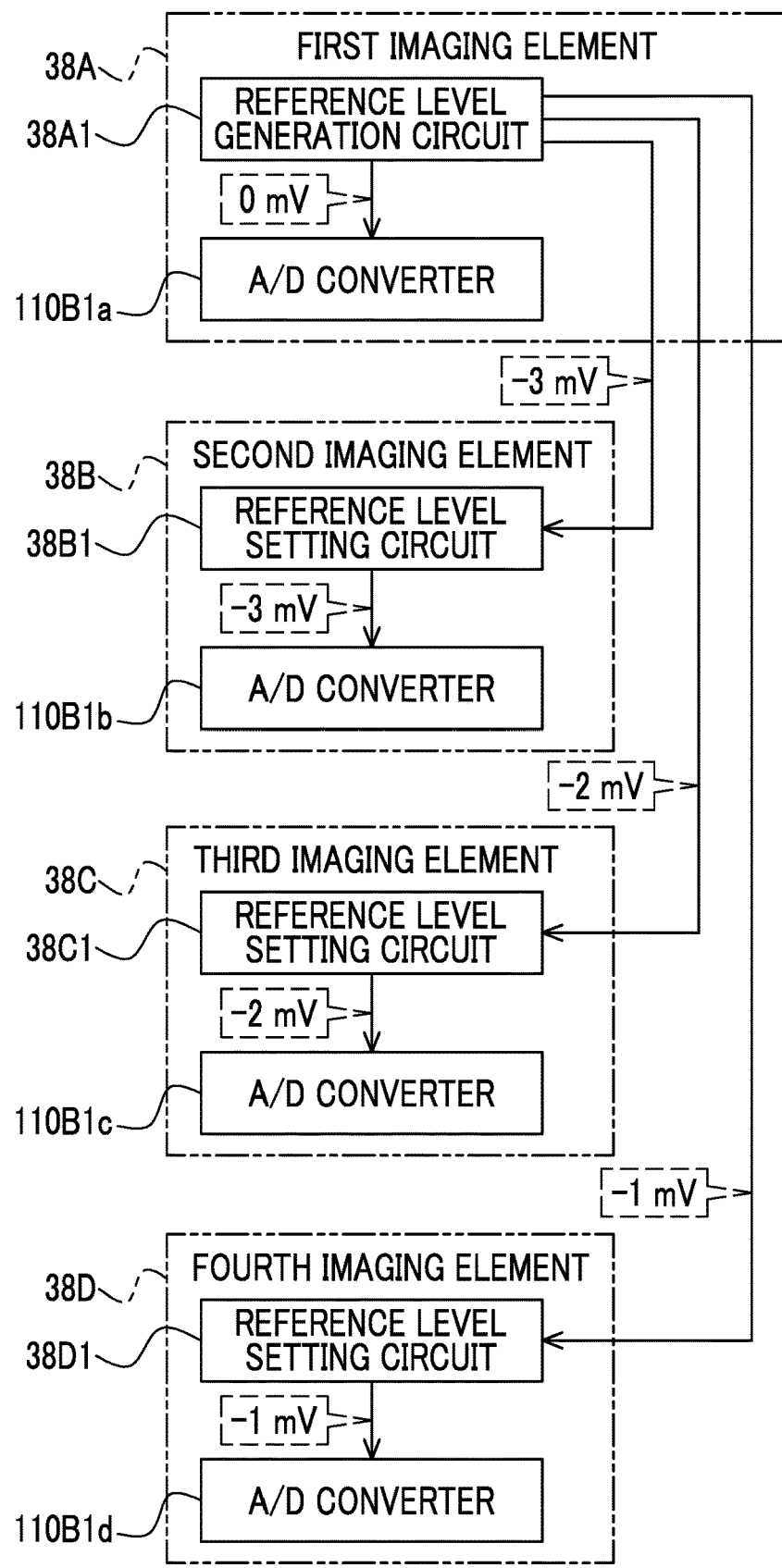
FIG. 10 is a block diagram illustrating an example of a configuration in which the first imaging element supplies a reference level to the second imaging element, the third imaging element, and the fourth imaging element in the imaging element unit according to the embodiment.

As illustrated in FIG. 10 as an example, the first imaging element 38A comprises a reference level generation circuit 38A1. The reference level generation circuit 38A1 generates a voltage as a reference, that is, a reference level, required for performing the A/D conversion by each of the A/D converters 110B1a, 110B1b, 110B1c, and 110B1d. In the example illustrated in FIG. 10, the reference level generation circuit 38A1 generates a reference level of 0 millivolts (mV) for the A/D converter 110B1a, generates a reference level of −3 mV for the A/D converter 110B1b, generates a reference level of −2 mV for the A/D converter 110B1c, and generates a reference level of −1 mV for the A/D converter 110B1d. For example, the reference level generation circuit 38A1 comprises a voltage divider (not illustrated) and generates the reference levels of 0 mV, −1 mV, −2 mV, and −3 mV by dividing a driving voltage supplied to the first imaging element 38A from an outside using the voltage divider.

The reference level of 0 mV is a reference level related to the first imaging element 38A. The reference level of −1 mV is a reference level related to the second imaging element 38B. The reference level of −2 mV is a reference level related to the third imaging element 38C. The reference level of −3 mV is a reference level related to the fourth imaging element 38D. In such a manner, the first imaging element 38A not only generates the reference level related to the first imaging element 38A but also generates the reference level related to each of the second imaging element 38B, the third imaging element 38C, and the fourth imaging element 38D. The first imaging element 38A supplies each generated reference level to the corresponding imaging element 38 of the second imaging element 38B, the third imaging element 38C, and the fourth imaging element 38D.

The reference level generation circuit 38A1 sets the reference level of 0 mV for the A/D converter 110B1a. The A/D converter 110B1a performs the A/D conversion in accordance with the reference level of 0 mV set by the reference level generation circuit 38A1.

The second imaging element 38B comprises a reference level setting circuit 38B1. The reference level setting circuit 38B1 is connected to the reference level generation circuit 38A1. The reference level setting circuit 38B1 is supplied with the reference level of −3 mV from the reference level generation circuit 38A1 and sets the supplied reference level of −3 mV for the A/D converter 110B1b. The A/D converter 110B1b performs the A/D conversion in accordance with the reference level of −3 mV set by the reference level setting circuit 38B1.

The third imaging element 38C comprises a reference level setting circuit 38C1. The reference level setting circuit 38C1 is connected to the reference level generation circuit 38A1. The reference level setting circuit 38C1 is supplied with the reference level of −2 mV from the reference level generation circuit 38A1 and sets the supplied reference level of −2 mV for the A/D converter 110B1c. The A/D converter 110B1c performs the A/D conversion in accordance with the reference level of −2 mV set by the reference level setting circuit 38C1.

The fourth imaging element 38D comprises a reference level setting circuit 38D1. The reference level setting circuit 38D1 is connected to the reference level generation circuit 38A1. The reference level setting circuit 38D1 is supplied with the reference level of −1 mV from the reference level generation circuit 38A1 and sets the supplied reference level of −1 mV for the A/D converter 110B1d. The A/D converter 110B1d performs the A/D conversion in accordance with the reference level of −1 mV set by the reference level setting circuit 38D1.

As illustrated in FIG. 11 as an example, the signal processing circuit 34 comprises the reception I/Fs 34A1, 34A2, 34A3, and 34A4. In addition, the signal processing circuit 34 comprises a combining circuit 34C.

In the first imaging element 38A, the first digital image data 70B1 obtained by performing the A/D conversion using the A/D converter 110B1a is output to the signal processing circuit 34 from the output I/F 110D2a. In the signal processing circuit 34, the reception I/F 34A1 receives the first digital image data 70B1 output from the output I/F 110D2a.

In the second imaging element 38B, the second digital image data 70B2 obtained by performing the A/D conversion using the A/D converter 110B1b is output to the signal processing circuit 34 from the output I/F 110D2b. In the signal processing circuit 34, the reception I/F 34A2 receives the second digital image data 70B2 output from the output I/F 110D2b.

In the third imaging element 38C, the third digital image data 70B3 obtained by performing the A/D conversion using the A/D converter 110B1c is output to the signal processing circuit 34 from the output I/F 110D2c. In the signal processing circuit 34, the reception I/F 34A3 receives the third digital image data 70B3 output from the output I/F 110D2c.

In the fourth imaging element 38D, the fourth digital image data 70B4 obtained by performing the A/D conversion using the A/D converter 110B1d is output to the signal processing circuit 34 from the output I/F 110D2d. In the signal processing circuit 34, the reception I/F 34A4 receives the fourth digital image data 70B4 output from the output I/F 110D2d.

In such a manner, the first digital image data 70B1 is obtained from the first imaging element 38A. The second digital image data 70B2 is obtained from the second imaging element 38B. The third digital image data 70B3 is obtained from the third imaging element 38C. The fourth digital image data 70B4 is obtained from the fourth imaging element 38D. That is, the first digital image data 70B1, the second digital image data 70B2, the third digital image data 70B3, and the fourth digital image data 70B4 are supplied to the signal processing circuit 34 as image data generated by performing imaging accompanying the A/D conversion of different reference levels. The first digital image data 70B1, the second digital image data 70B2, the third digital image data 70B3, and the fourth digital image data 70B4 are an example of a "plurality of pieces of image data" according to the embodiment of the technology of the present disclosure.

The combining circuit 34C generates single image data by combining the first digital image data 70B1 received by the reception I/F 34A1, the second digital image data 70B2 received by the reception I/F 34A2, the third digital image data 70B3 received by the reception I/F 34A3, and the fourth digital image data 70B4 received by the reception I/F 34A4. The output I/F 34B outputs the single image data generated by the combining circuit 34C to the controller 15.

Specifically, the combining circuit 34C generates the single image data of 10 bits in units of pixels by combining four frames of the digital image data 70B of 8 bits in units of pixels, and the output I/F 34B outputs the single image data of 10 bits in units of pixels to the controller 15. The number of bits, in units of pixels, of the single image data output from the signal processing circuit 34 is greater than the number of bits of the digital image data 70B of five frames in units of pixels.

Figure 12:
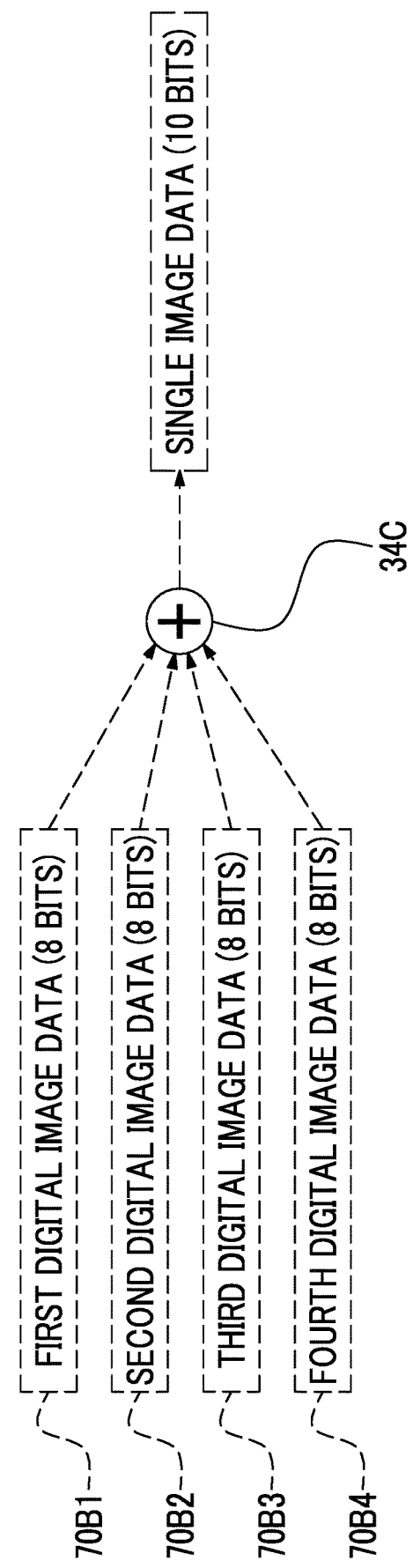
FIG. 12 is a block diagram illustrating an example of a process of generating single image data by combining first digital image data, second digital image data, third digital image data, and fourth digital image data generated by the imaging element unit according to the embodiment.

Here, for example, "combining" refers to addition using an adder (not illustrated). As illustrated in FIG. 12 as an example, the number of bits of the first digital image data 70B1, the second digital image data 70B2, the third digital image data 70B3, and the fourth digital image data 70B4 in units of pixels is "8". By adding the first digital image data 70B1, the second digital image data 70B2, the third digital image data 70B3, and the fourth digital image data 70B4 using the combining circuit 34C, the single image data of 10 bits in units of pixels is generated. The signal processing circuit 34 is an example of a "processing portion (processor)" according to the embodiment of the technology of the present disclosure.

Figure 13:
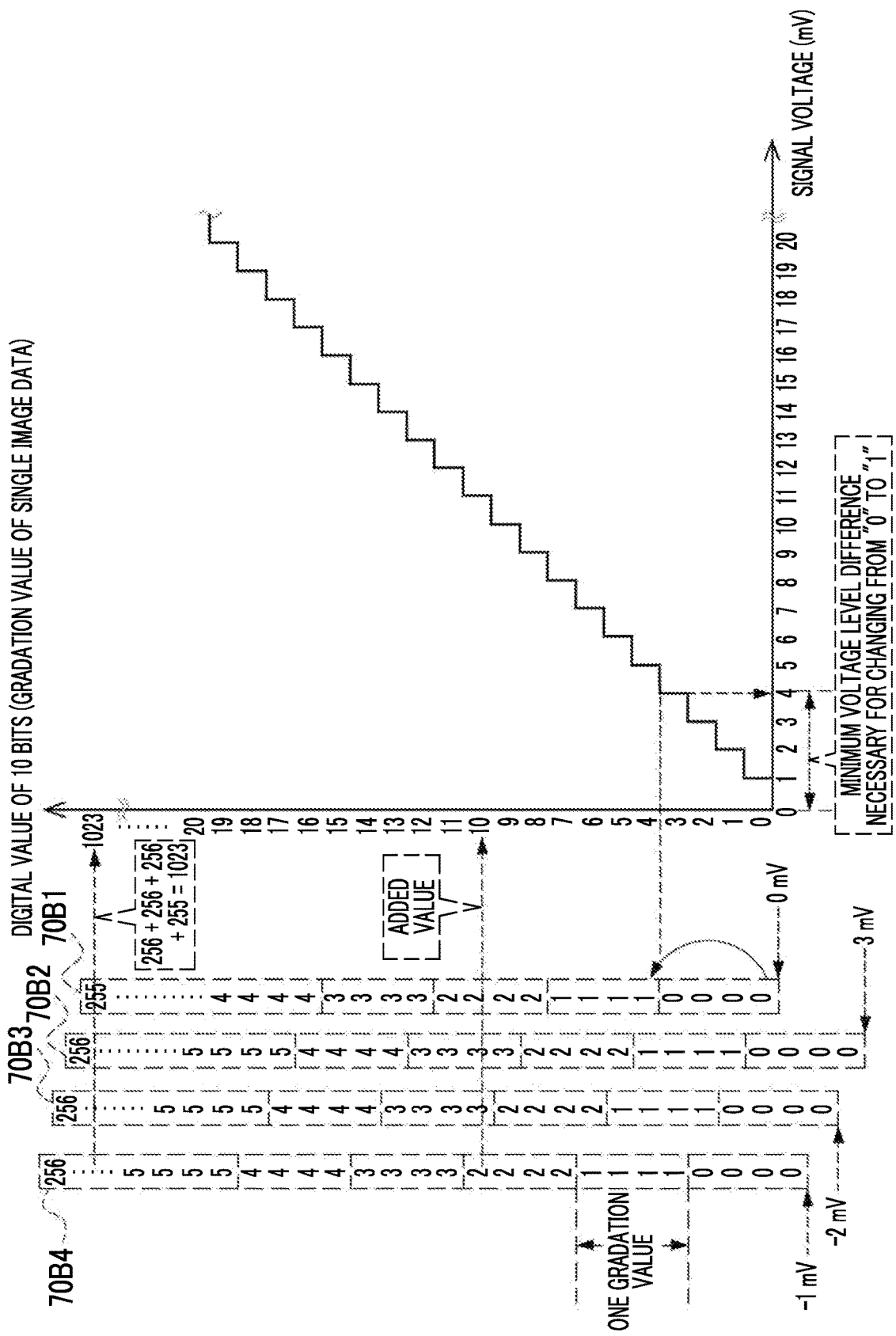
FIG. 13 is a conceptual diagram illustrating an example of a correspondence relationship among a driving signal voltage for an A/D converter according to the embodiment, a digital value of the single image data of 10 bits in units of pixels, a digital value of the first digital image data of 8 bits in units of pixels, a digital value of the second digital image data of 8 bits in units of pixels, the third digital image data of 8 bits in units of pixels, and the fourth digital image data of 8 bits in units of pixels.

FIG. 13 illustrates a graph illustrating an example of correlation between a driving signal voltage for the A/D converter 110B1 and a digital value of the single image data of 10 bits in units of pixels. In the graph illustrated in FIG. 13, a horizontal axis denotes the signal voltage, and a vertical axis denotes the digital value of the single image data of 10 bits in units of pixels. In addition, in FIG. 13, an example of a correspondence relationship among a digital value of the first digital image data 70B1 of 8 bits in units of pixels, a digital value of the second digital image data 70B2 of 8 bits in units of pixels, the third digital image data 70B3 of 8 bits in units of pixels, the fourth digital image data 70B4 of 8 bits in units of pixels, and the digital value of the single image data of 10 bits in units of pixels is illustrated.

The "digital value" here means a so-called "gradation value". Thus, the single image data of 10 bits in units of pixels is represented by gradation values of "0" to "1023".

As illustrated in FIG. 13 as an example, a gradation value of the digital image data 70B is "256". A minimum voltage level difference necessary for increasing the gradation value of the digital image data 70B by "1" using the A/D converter 110B1 is 4 mV. For example, the minimum voltage level difference necessary for changing the gradation value of the digital image data 70B from "0" to "1" is 4 mV. That is, in a case of changing the gradation value by 1 at a time from "0" to "256", the A/D converter 110B1 requires a signal voltage of "M (=integer greater than or equal to 1)×4" mV.

The signal voltage required for changing the gradation value of 8 bits by 1 at a time is calculated by incrementing M of "M×4" by 1.

In such a manner, the A/D converter 110B1 requires a voltage level difference of 4 mV in order to increase the gradation value of 8 bits by "1". Therefore, in the example illustrated in FIG. 13, for convenience of description, one gradation value for each of the first digital image data 70B1, the second digital image data 70B2, the third digital image data 70B3, and the fourth digital image data 70B4 is represented by lining up the same four numerical values in order to facilitate understanding of a relationship among the gradation values of the first digital image data 70B1, the second digital image data 70B2, the third digital image data 70B3, and the fourth digital image data 70B4 and a relationship between the gradation value of 8 bits and the gradation value of 10 bits.

As illustrated in FIG. 13 as an example, a difference (1 mV) in reference level among the first digital image data 70B1, the second digital image data 70B2, the third digital image data 70B3, and the fourth digital image data 70B4 is less than the minimum voltage level difference (4 mV) necessary for increasing the gradation value of the digital image data 70B by "1" using the A/D converter 110B1.

The difference (1 mV) in reference level among the first digital image data 70B1, the second digital image data 70B2, the third digital image data 70B3, and the fourth digital image data 70B4 is a value corresponding to a value obtained by dividing, by the number of frames of the digital image data 70B, the minimum voltage level difference (4 mV) necessary for increasing the gradation value of the digital image data 70B by "1" using the A/D converter 110B1. The "number of frames of the digital image data 70B" here refers to four frames of the first digital image data 70B1, the second digital image data 70B2, the third digital image data 70B3, and the fourth digital image data 70B4.

In the example illustrated in FIG. 13, gradation values "0 to 255" of the first digital image data 70B1 are lined up along the vertical axis of the graph in a state where positions of the gradation value "0" of the first digital image data 70B1 and the gradation value "0" of 10 bits are matched. In addition, gradation values "0 to 256" of each of the second digital image data 70B2, the third digital image data 70B3, and the fourth digital image data 70B4 are lined up along the vertical axis of the graph in a state where the first digital image data 70B1, the second digital image data 70B2, the third digital image data 70B3, and the fourth digital image data 70B4 are shifted in a vertical axis direction of the graph by the difference in reference level therebetween.

As illustrated in FIG. 13 as an example, a gradation value of the single image data of 10 bits in units of pixels is a value obtained by adding the gradation values of the first digital image data 70B1, the second digital image data 70B2, the third digital image data 70B3, and the fourth digital image data 70B4. For example, by adding the gradation value "2" of the fourth digital image data 70B4, the gradation value "3" of the third digital image data 70B3, the gradation value "3" of the second digital image data 70B2, and the gradation value "2" of the first digital image data 70B1 using the combining circuit 34C (refer to FIG. 11 and FIG. 12), "10" is obtained as the gradation value of the single image data of 10 bits in units of pixels. In addition, for example, by adding the gradation value "256" of the fourth digital image data 70B4, the gradation value "256" of the third digital image data 70B3, the gradation value "256" of the second digital image data 70B2, and the gradation value "255" of the first digital image data 70B1 using the combining circuit 34C (refer to FIG. 11 and FIG. 12), "1023" is obtained as the gradation value of the single image data of 10 bits in units of pixels.

Next, an action of the smart device 10 will be described with reference to FIG. 14.

Figure 14:
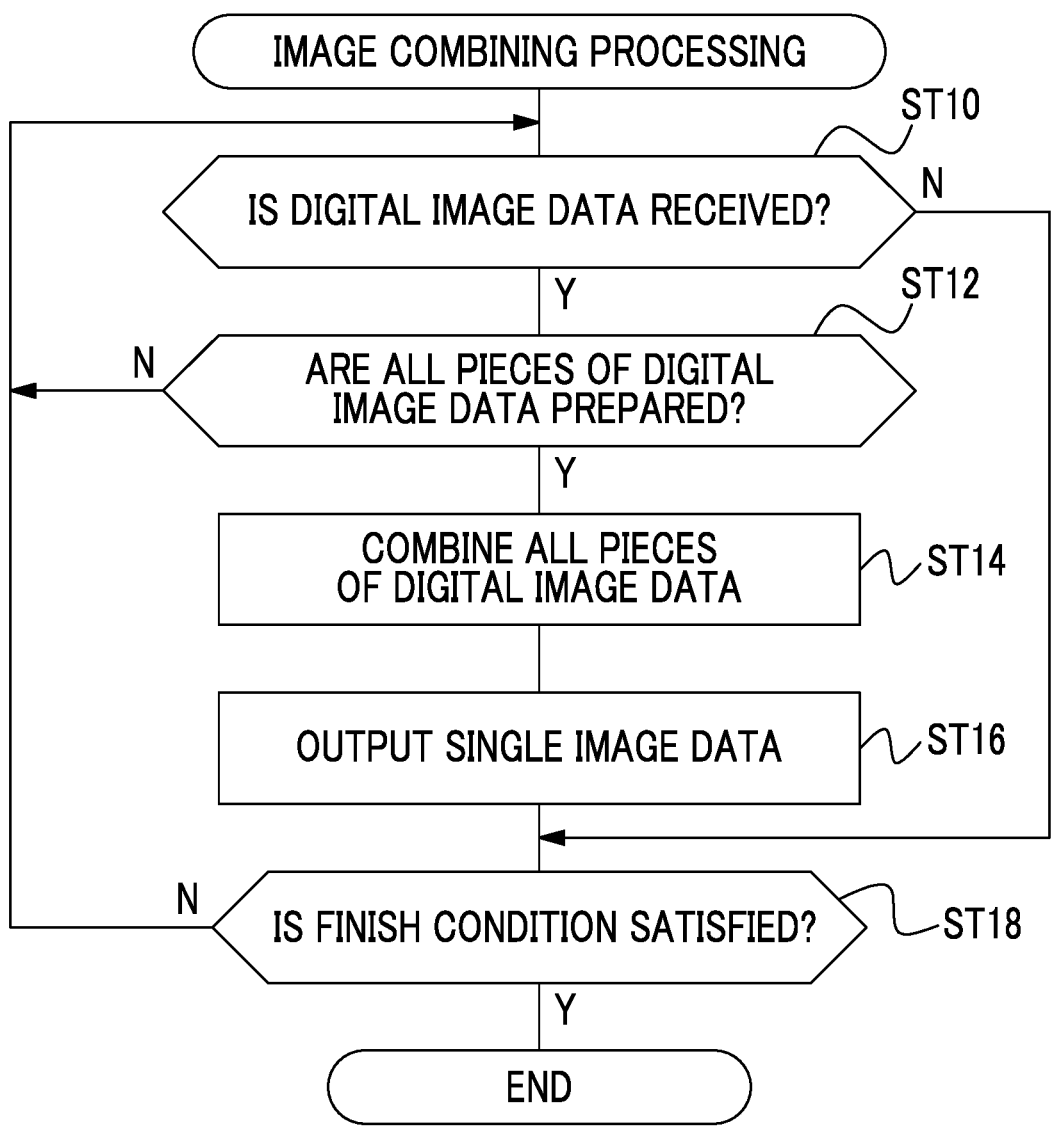
FIG. 14 is a flowchart illustrating an example of a flow of image combining processing according to the embodiment.

FIG. 14 illustrates an example of a flow of image combining processing executed by the signal processing circuit 34. In the image combining processing illustrated in FIG. 14, first, in step ST10, the signal processing circuit 34 determines whether or not the digital image data 70B from the imaging element 38 is received by the reception I/F 34A. In step ST10, in a case where the digital image data 70B from the imaging element 38 is not received by the reception I/F 34A, a negative determination is made, and the image combining processing transitions to step ST18. In step ST10, in a case where the digital image data 70B from the imaging element 38 is received by the reception I/F 34A, a positive determination is made, and the image combining processing transitions to step ST12.

In step ST12, the signal processing circuit 34 determines whether or not all pieces of the digital image data 70B are prepared by receiving the digital image data 70B using the reception I/F 34A. Here, "all pieces of the digital image data 70B" refers to the first digital image data 70B1, the second digital image data 70B2, the third digital image data 70B3, and the fourth digital image data 70B4.

In step ST12, in a case where all pieces of the digital image data 70B are not prepared, a negative determination is made, and the image combining processing transitions to step ST10. In a case where all pieces of the digital image data 70B are prepared, a positive determination is made, and the image combining processing transitions to step ST14.

In step ST14, the signal processing circuit 34 generates the single image data by combining all pieces of the digital image data 70B received by the reception I/F 34A in step ST10. Then, the image combining processing transitions to step ST16. That is, in a case where processing of step ST14 is executed by the signal processing circuit 34, the single image data of 10 bits in units of pixels is generated by adding the first digital image data 70B1 of 8 bits in units of pixels, the second digital image data 70B2 of 8 bits in units of pixels, the third digital image data 70B3 of 8 bits in units of pixels, and the fourth digital image data 70B4 of 8 bits in units of pixels.

In step ST16, the signal processing circuit 34 outputs the single image data obtained by executing processing of step ST14 to the controller 15. Then, the image combining processing transitions to step ST18.

An image (live view image or the like) based on the single image data output to the controller 15 from the signal processing circuit 34 is displayed on the display 26 under control of the CPU 15A. In addition, the single image data output to the controller 15 from the signal processing circuit 34 is stored in the storage 15B, the smart device, the personal computer, the server, the USB memory, and/or the memory card or the like under control of the CPU 15A.

Here, an example of a form of displaying the image based on the single image data output to the controller 15 from the signal processing circuit 34 on the display 26 and storing the single image data in the storage 15B, the smart device, the personal computer, the server, the USB memory, and/or the memory card or the like is illustratively described. However, the technology of the present disclosure is not limited thereto. Any of displaying the image based on the single image data on the display 26 and storing the single image data in the storage 15B, the smart device, the personal computer, the server, the USB memory, and/or the memory card or the like may be performed by the CPU 15A.

In step ST18, the signal processing circuit 34 determines whether or not a condition (hereinafter, referred to as an "image combining processing finish condition") under which the image combining processing is finished is satisfied. A condition that an instruction to finish the image combining processing is received by the reception device 84 (refer to FIG. 6) is exemplified as an example of the image combining processing finish condition. In step ST18, in a case where the image combining processing finish condition is not satisfied, a negative determination is made, and the image combining processing transitions to step ST10. In step ST18, in a case where the image combining processing finish condition is satisfied, a positive determination is made, and the image combining processing is finished.

As described above, in the smart device 10, the first digital image data 70B1, the second digital image data 70B2, the third digital image data 70B3, and the fourth digital image data 70B4 are generated by the imaging element unit 14. The first digital image data 70B1, the second digital image data 70B2, the third digital image data 70B3, and the fourth digital image data 70B4 are image data generated by performing the imaging accompanying the A/D conversion of different reference levels. The first digital image data 70B1, the second digital image data 70B2, the third digital image data 70B3, and the fourth digital image data 70B4 are combined by the combining circuit 34C of the signal processing circuit 34. Accordingly, the single image data is generated. The number of bits of each of the first digital image data 70B1, the second digital image data 70B2, the third digital image data 70B3, and the fourth digital image data 70B4 in units of pixels is "8". The number of bits of the single image data in units of pixels is "10". That is, the number of bits of the single image data in units of pixels is greater than the number of bits of the digital image data 70B in units of pixels.

According to the present configuration, since the digital image data 70B of 8 bits in units of pixels is generated by the imaging element 38, the frame rate can be increased, compared to a case where the digital image data 70B of 10 bits in units of pixels is generated by the imaging element 38. In addition, the image indicated by the single image data (single image data output from the signal processing circuit 34) of 10 bits in units of pixels has higher image quality than an image indicated by the digital image data 70B (digital image data 70B generated by the imaging element 38) of 8 bits in units of pixels. Thus, according to the present configuration, a high frame rate and high image quality can be implemented, compared to a case where imaging accompanying the A/D conversion of the same reference level is performed at all times.

In addition, in the smart device 10, a plurality of pieces of the digital image data 70B are output from a plurality of the imaging elements 38. That is, the first digital image data 70B1 is output by the first imaging element 38A. The second digital image data 70B2 is output by the second imaging element 38B. The third digital image data 70B3 is output by the third imaging element 38C. The fourth digital image data 70B4 is output by the fourth imaging element 38D.

Thus, according to the present configuration, the plurality of pieces of digital image data 70B for generating the single image data can be obtained without accompanying complex processing, compared to a case where the plurality of pieces of digital image data 70B for generating the single image data are output from a single imaging element 38.

In addition, in the smart device 10, the first imaging element 38A not only generates the reference level related to the first imaging element 38A but also generates the reference level related to each of the second imaging element 38B, the third imaging element 38C, and the fourth imaging element 38D. Each reference level generated by the first imaging element 38A is supplied to the corresponding imaging element 38 of the second imaging element 38B, the third imaging element 38C, and the fourth imaging element 38D.

Thus, according to the present configuration, a decrease in image quality caused by an error in reference level among the first imaging element 38A, the second imaging element 38B, the third imaging element 38C, and the fourth imaging element 38D can be suppressed, compared to a case where the first imaging element 38A, the second imaging element 38B, the third imaging element 38C, and the fourth imaging element 38D generate the reference levels independently of each other and use the reference levels for the respective A/D conversion thereof.

In addition, in the smart device 10, the first digital image data 70B1, the second digital image data 70B2, the third digital image data 70B3, and the fourth digital image data 70B4 are combined by addition using the combining circuit 34C.

Thus, according to the present configuration, the single image data of more bits than the digital image data 70B can be easily generated, compared to a case of performing combining using means other than addition.

In addition, in the smart device 10, the difference in reference level among the first digital image data 70B1, the second digital image data 70B2, the third digital image data 70B3, and the fourth digital image data 70B4 is less than the minimum voltage level difference necessary for changing the individual digital values of the first digital image data 70B1, the second digital image data 70B2, the third digital image data 70B3, and the fourth digital image data 70B4.

Thus, according to the present configuration, loss of information between bits due to the A/D conversion can be suppressed, compared to a case where the difference in reference level among the first digital image data 70B1, the second digital image data 70B2, the third digital image data 70B3, and the fourth digital image data 70B4 is greater than or equal to the minimum voltage level difference necessary for changing the individual digital values of the first digital image data 70B1, the second digital image data 70B2, the third digital image data 70B3, and the fourth digital image data 70B4.

In addition, in the smart device 10, the value corresponding to the value obtained by dividing, by the number of frames of the digital image data 70B, the minimum voltage level difference necessary for changing the individual digital values of the first digital image data 70B1, the second digital image data 70B2, the third digital image data 70B3, and the fourth digital image data 70B4 is employed as the difference in reference level among the first digital image data 70B1, the second digital image data 70B2, the third digital image data 70B3, and the fourth digital image data 70B4.

Thus, according to the present configuration, loss of information between bits due to the A/D conversion can be suppressed, compared to a case where the difference in reference level among the first digital image data 70B1, the second digital image data 70B2, the third digital image data 70B3, and the fourth digital image data 70B4 is greater than the value obtained by dividing, by the number of frames of the digital image data 70B, the minimum voltage level difference necessary for changing the individual digital values of the first digital image data 70B1, the second digital image data 70B2, the third digital image data 70B3, and the fourth digital image data 70B4.

In addition, in the smart device 10, the imaging element in which the photoelectric conversion element 42, the processing circuit 110, and the memory 112 are formed in one chip is employed as the imaging element 38. Accordingly, portability of the imaging element 38 is increased, compared to an imaging element in which the photoelectric conversion element 42, the processing circuit 110, and the memory 112 are not formed in one chip. In addition, a degree of design freedom can be increased, compared to a case of the imaging element in which the photoelectric conversion element 42, the processing circuit 110, and the memory 112 are not formed in one chip. Furthermore, it is possible to contribute to size reduction of the smart device 10, compared to a case of the imaging element in which the photoelectric conversion element 42, the processing circuit 110, and the memory 112 are not formed in one chip.

In addition, in the smart device 10, as illustrated in FIG. 7 as an example, the laminated imaging element in which the photoelectric conversion element 42 is laminated with the memory 112 is employed as the imaging element 38. Accordingly, since a wire that connects the photoelectric conversion element 42 to the memory 112 can be shortened, a wire delay can be reduced. Consequently, a transfer speed of the image data from the photoelectric conversion element 42 to the memory 112 can be increased, compared to a case where the photoelectric conversion element 42 and the memory 112 are not laminated. Improving the transfer speed contributes to high-speed processing in the entire processing circuit 110. In addition, the degree of design freedom can be increased, compared to a case of not laminating the photoelectric conversion element 42 and the memory 112.

Furthermore, it is possible to contribute to size reduction of the smart device 10, compared to a case of not laminating the photoelectric conversion element 42 and the memory 112.

In addition, in the smart device 10, the live view image or the like based on the single image data output by the signal processing circuit 34 is displayed on the display 26 by the CPU 15A. Accordingly, the live view image or the like based on the single image data output by the signal processing circuit 34 can be visible to the user.

Furthermore, in the smart device 10, the single image data output by the signal processing circuit 34 is stored in the storage 15B, the smart device, the personal computer, the server, the USB memory, and/or the memory card or the like by the CPU 15A. Accordingly, the single image data output by the signal processing circuit 34 can be managed.

In the embodiment, while an example of a form of adding the first digital image data 70B1, the second digital image data 70B2, the third digital image data 70B3, and the fourth digital image data 70B4 using the combining circuit 34C is illustratively described, the technology of the present disclosure is not limited thereto. For example, the single image data may be generated by adding three of the first digital image data 70B1, the second digital image data 70B2, the third digital image data 70B3, and the fourth digital image data 70B4 using the combining circuit 34C. In this case, multiplied signal value image data obtained by multiplying a signal value of one of the three pieces of the digital image data 70B and the remaining two pieces of the digital image data 70B may be added.

Figure 15:
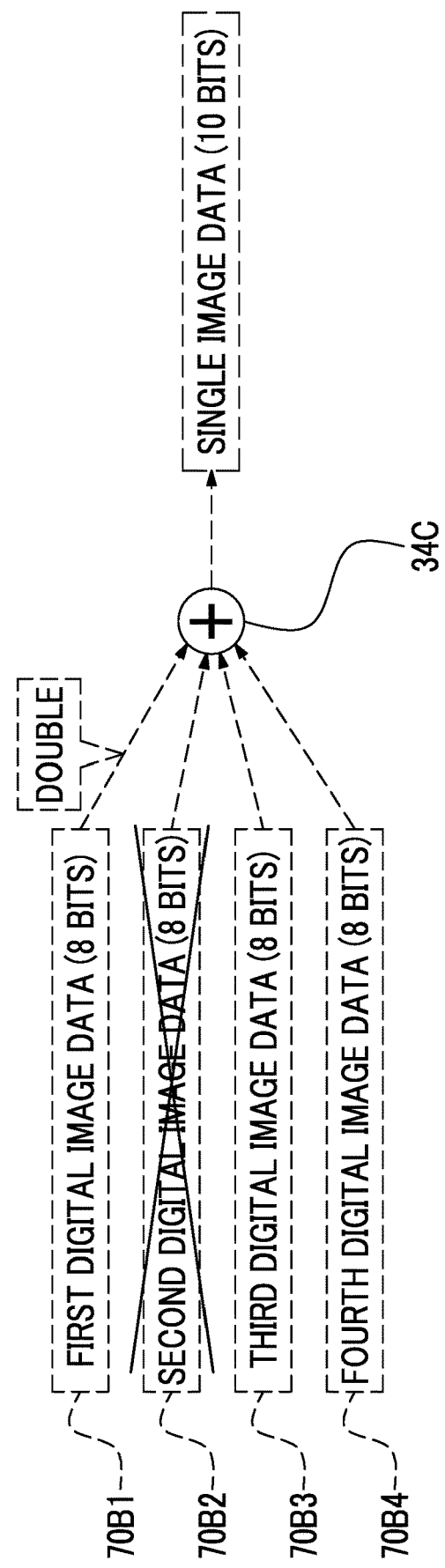
FIG. 15 is a block diagram illustrating an example of a process of generating the single image data by combining the first digital image data, the third digital image data, and the fourth digital image data generated by the imaging element unit according to the embodiment.

For example, as illustrated in FIG. 15, in a case of not using the second digital image data 70B2 among the first digital image data 70B1, the second digital image data 70B2, the third digital image data 70B3, and the fourth digital image data 70B4 (for example, in a case of not using the second imaging element 38B), a signal value of the first digital image data 70B1 is multiplied by the control circuit 110C of the first imaging element 38A or the signal processing circuit 34. For example, "multiplication" here refers to multiplication of the signal value of the digital image data 70B in units of pixels. In the example illustrated in FIG. 15, the signal value of the first digital image data 70B1 is doubled, and the single image data is generated by using the first digital image data 70B1 having the doubled signal value. That is, the single image data of 10 bits in units of pixels is generated by adding the first digital image data 70B1 having the doubled signal value, the third digital image data 70B3, and the fourth digital image data 70B4 using the combining circuit 34C. Here, a case where one piece of the digital image data 70B is missing is illustrated. However, even in a case where a plurality of pieces of the digital image data 70B are missing, the signal value of the other digital image data 70B may be multiplied by the number of missing pieces.

According to the present configuration, even in a case where any of the plurality of pieces of digital image data 70B is missing, brightness corresponding to brightness of the image indicated by the single image data generated in a case where the digital image data 70B is not missing can be obtained as the brightness of the image indicated by the single image data.

Figure 16:
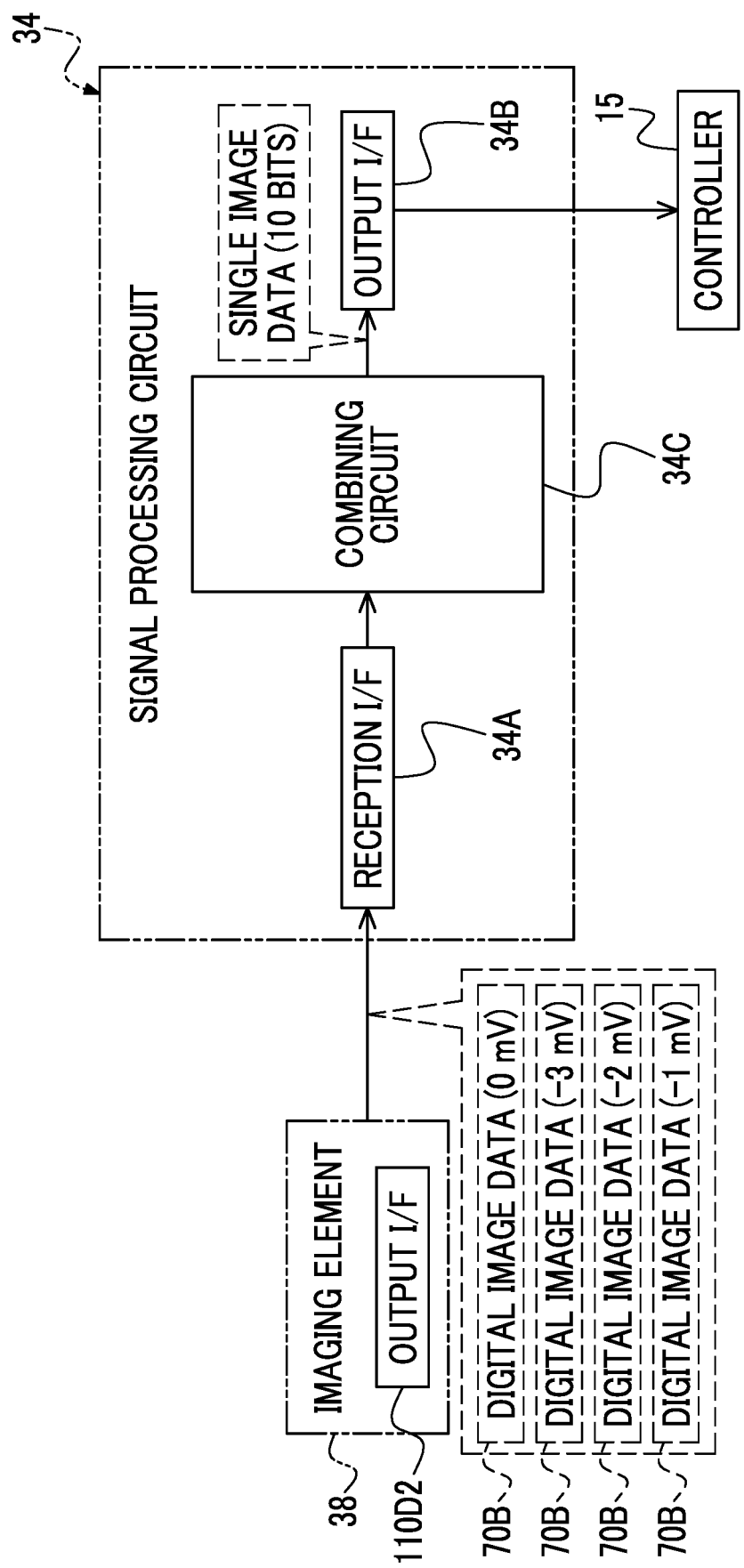
FIG. 16 is a block diagram illustrating an example of a configuration in which digital image data of four frames of which the reference levels of A/D conversion are different from each other are combined by the imaging element according to the embodiment.

In the embodiment, an example of a form of outputting the digital image data 70B to the signal processing circuit 34 from each of the first imaging element 38A, the second imaging element 38B, the third imaging element 38C, and the fourth imaging element 38D is illustratively described. However, the technology of the present disclosure is not limited thereto. For example, as illustrated in FIG. 16, the digital image data 70B of four frames generated by performing the imaging accompanying the A/D conversion of different reference levels using one imaging element 38 may be output to the signal processing circuit 34 by the output I/F 110D2.

In this case, the digital image data 70B of the reference level of 0 mV, the digital image data 70B of the reference level of −3 mV, the digital image data 70B of the reference level of −2 mV, and the digital image data 70B of the reference level of −1 mV are generated by the imaging element 38. The digital image data 70B of the reference level 0 mV, the digital image data 70B of the reference level of −3 mV, the digital image data 70B of the reference level of −2 mV, and the digital image data 70B of the reference level of −1 mV are received by the reception I/F 34A. The digital image data 70B of the reference level 0 mV, the digital image data 70B of the reference level of −3 mV, the digital image data 70B of the reference level of −2 mV, and the digital image data 70B of the reference level of −1 mV received by the reception I/F 34A are combined as described in the embodiment using the combining circuit 34C. Accordingly, the single image data of 10 bits in units of pixels is generated.

Figure 17:
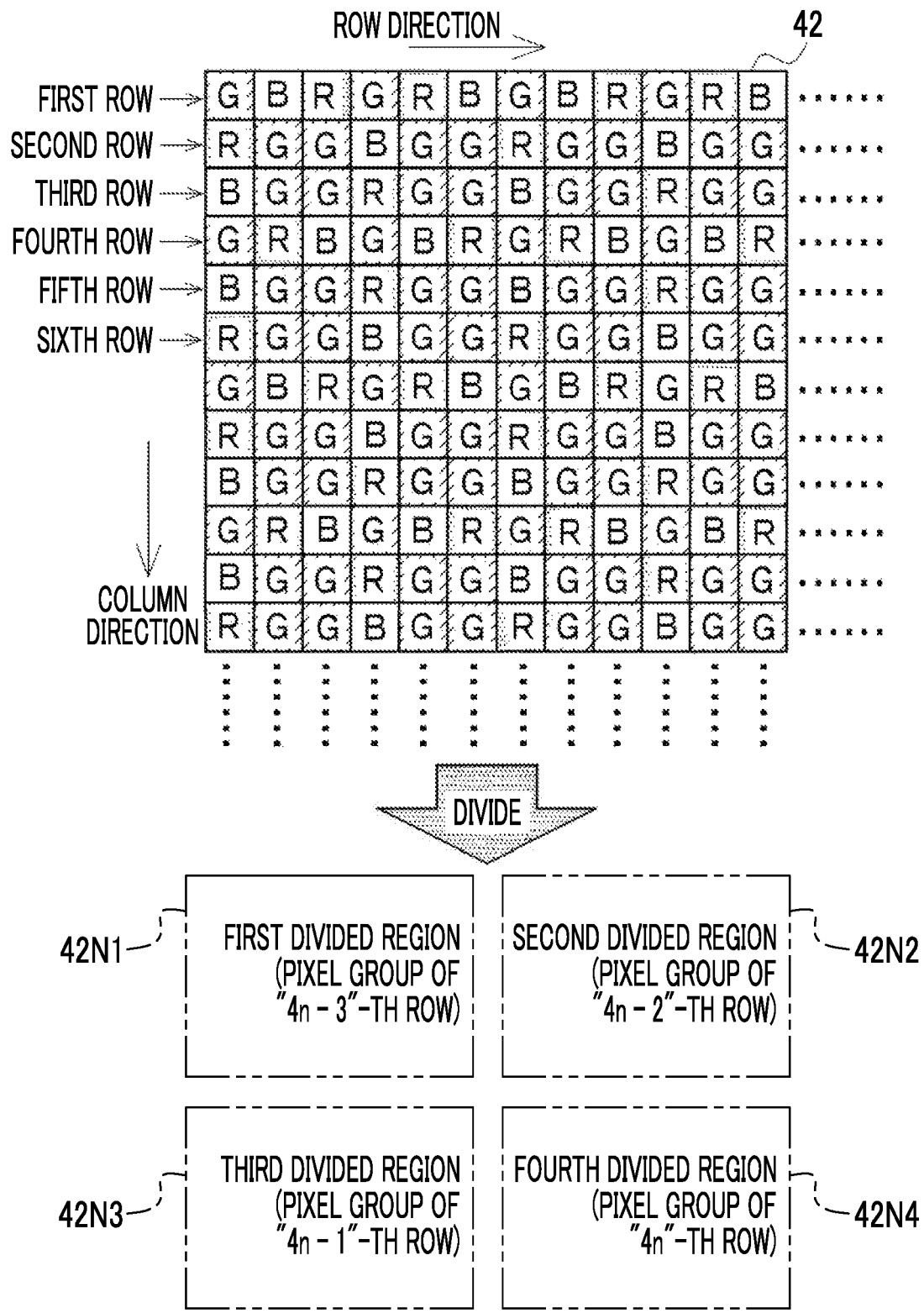
FIG. 17 is a conceptual diagram illustrating an example of a pixel region of a photoelectric conversion element included in the imaging element according to the embodiment and first to fourth divided regions obtained by dividing the pixel region of the photoelectric conversion element.

In order to generate the plurality of pieces of digital image data 70B using one imaging element 38, as illustrated in FIG. 17 as an example, the imaging accompanying the A/D conversion of different reference levels is performed for four divided regions by the imaging element 38.

Specifically, the imaging element 38 performs the imaging accompanying the A/D conversion of different reference levels for a first divided region 42N1, a second divided region 42N2, a third divided region 42N3, and a fourth divided region 42N4 obtained by dividing a pixel region of the photoelectric conversion element 42. In a case where n denotes an integer greater than or equal to 1, the first divided region 42N1 is a region formed of a pixel group of a "4n-3"-th row in the pixel region of the photoelectric conversion element 42. In addition, the second divided region 42N2 is a region formed of a pixel group of a "4n-2"-th row in the pixel region of the photoelectric conversion element 42. In addition, the third divided region 42N3 is a region formed of a pixel group of a "4n-1"-th row in the pixel region of the photoelectric conversion element 42. Furthermore, the fourth divided region 42N4 is a region formed of a pixel group of a "4n"-th row in the pixel region of the photoelectric conversion element 42.

The digital image data 70B of the reference level of 0 mV is generated by performing imaging accompanying the A/D conversion of the reference level of 0 mV for the first divided region 42N1 using the imaging element 38. In addition, the digital image data 70B of the reference level of −3 mV is generated by performing imaging accompanying the A/D conversion of the reference level of −3 mV for the second divided region 42N2 using the imaging element 38. In addition, the digital image data 70B of the reference level of −2 mV is generated by performing imaging accompanying the A/D conversion of the reference level of −2 mV for the third divided region 42N3 using the imaging element 38. Furthermore, the digital image data 70B of the reference level of −1 mV is generated by performing imaging accompanying the A/D conversion of the reference level of −1 mV for the fourth divided region 42N4 using the imaging element 38.

According to the examples illustrated in FIG. 16 and FIG. 17, the plurality of pieces of digital image data 70B are generated by performing, using the imaging element 38, the imaging accompanying the A/D conversion of different reference levels for a plurality of divided regions obtained by dividing the pixel region of the imaging element 38. The single image data of 10 bits in units of pixels is generated by combining the plurality of pieces of digital image data 70B generated for the plurality of divided regions using the signal processing circuit 34. Accordingly, a high frame rate and high image quality can be implemented regardless of the number of imaging elements 38, compared to a case where the imaging accompanying the A/D conversion of the same reference level is performed at all times.

In the example illustrated in FIG. 17, the plurality of divided regions obtained by dividing the pixel region of the photoelectric conversion element 42 in units of rows are illustrated. However, the technology of the present disclosure is not limited thereto. For example, the imaging accompanying the A/D conversion of different reference levels may be performed for a plurality of divided regions obtained by dividing the pixel region of the photoelectric conversion element 42 in units of columns. In addition, the imaging accompanying the A/D conversion of different reference levels may be performed for a plurality of divided regions obtained by dividing the pixel region of the photoelectric conversion element 42 in the row direction and the column direction. In addition, the imaging accompanying the A/D conversion of different reference levels may be performed for a plurality of divided regions obtained by equally dividing the pixel region of the photoelectric conversion element 42 into rectangular shapes. In such a manner, the technology of the present disclosure is established with any division form, provided that the pixel region of the photoelectric conversion element 42 is divided for each reference level of the A/D conversion.

In the smart device 10, imaging using the rolling shutter method is performed. In a case where imaging using the rolling shutter method is performed, a rolling shift occurs. The "rolling shift" here refers to a rolling shift of the electronic shutter. For example, the rolling shift of the electronic shutter refers to a difference in time from a start of exposure on a head line of the photoelectric conversion element 42 until a start of exposure on a last line.

Figure 18A:
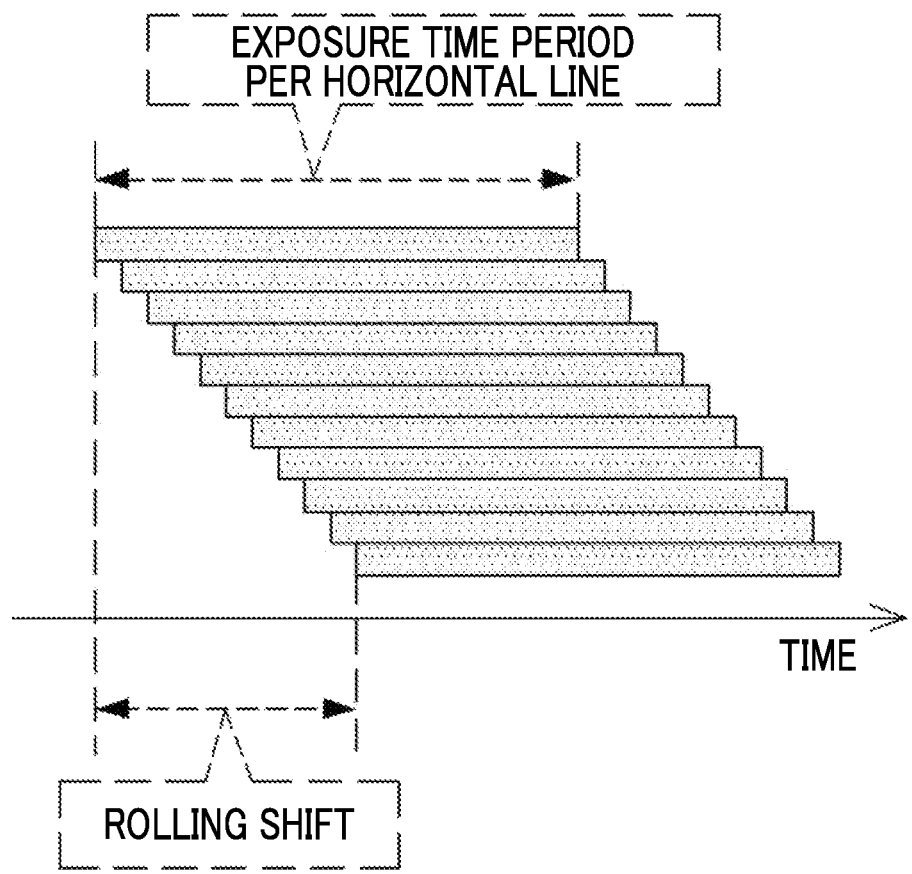
FIG. 18A is a conceptual diagram illustrating an example of a rolling shift that occurs in a case where the A/D conversion of a few bits is performed by the A/D converter of the imaging element according to the embodiment.
Figure 18B:
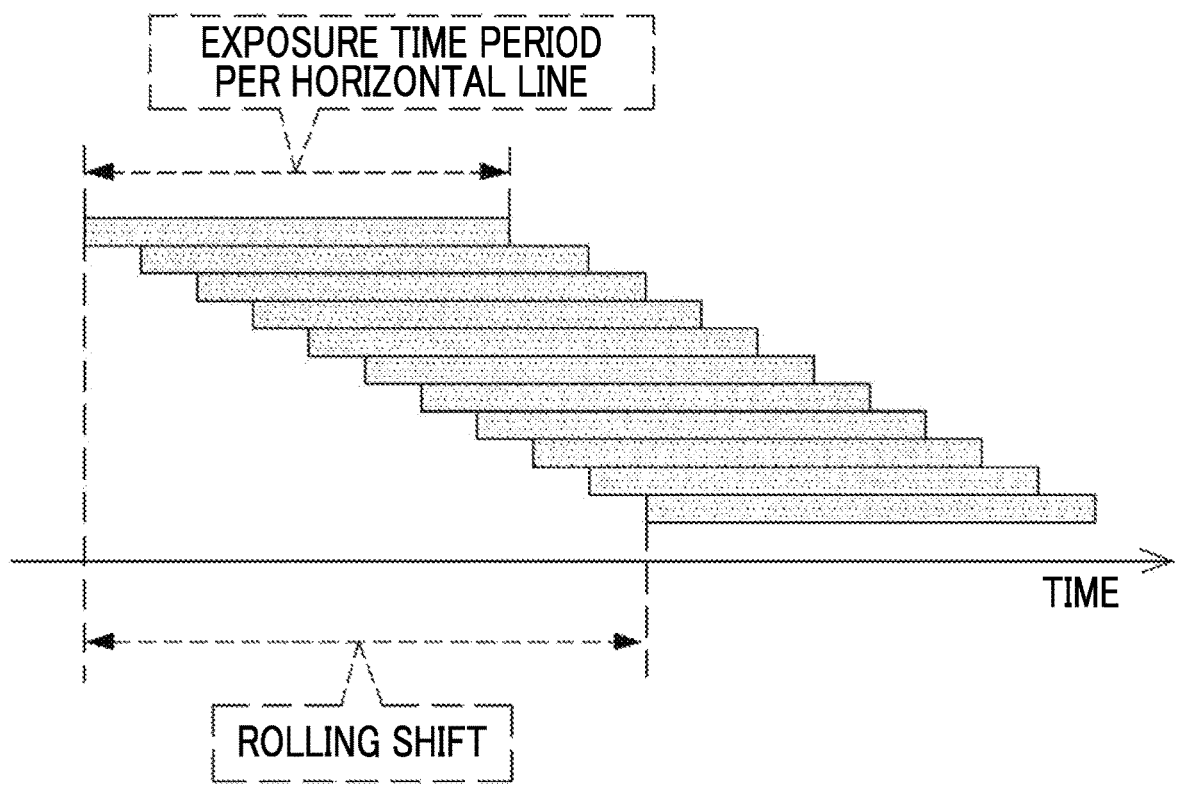
FIG. 18B is a conceptual diagram illustrating an example of the rolling shift that occurs in a case where the A/D conversion of a few tens of bits is performed by the A/D converter of the imaging element according to the embodiment.

A magnitude of the rolling shift is affected by a time period required for the A/D conversion. For example, a time period required for performing the A/D conversion of a few bits in units of pixels is shorter than a time period in a case where the A/D conversion of a few tens of bits in units of pixels is performed. Thus, as illustrated in FIG. 18A and FIG. 18B, the rolling shift in a case where the A/D conversion of a few bits in units of pixels is performed is less than the rolling shift in a case where the A/D conversion of a few tens of bits in units of pixels is performed. In addition, the rolling shift appears as distortion of the image indicated by the digital image data 70B. For example, the time period required for performing the A/D conversion of a few bits in units of pixels is shorter than the time period in a case where the A/D conversion of a few tens of bits in units of pixels is performed, and the rolling shift illustrated in FIG. 18A is less than the rolling shift illustrated in FIG. 18B. Thus, as illustrated in FIG. 19 as an example, distortion of the image indicated by the digital image data 70B obtained by performing imaging accompanying the A/D conversion of a few bits in units of pixels using the imaging element 38 is small, compared to distortion of the image indicated by the digital image data 70B obtained by performing imaging accompanying the A/D conversion of a few tens of bits in units of pixels using the imaging element 38.

Accordingly, in the smart device 10, since the single image data of 10 bits is generated by combining, using the signal processing circuit 34, the plurality of pieces of digital image data 70B obtained by performing imaging accompanying the A/D conversion of 8 bits using the imaging element 38, an image having small distortion caused by the rolling shift can be obtained, compared to a case where the digital image data 70B of 10 bits is generated by the imaging element 38.

Figure 20:
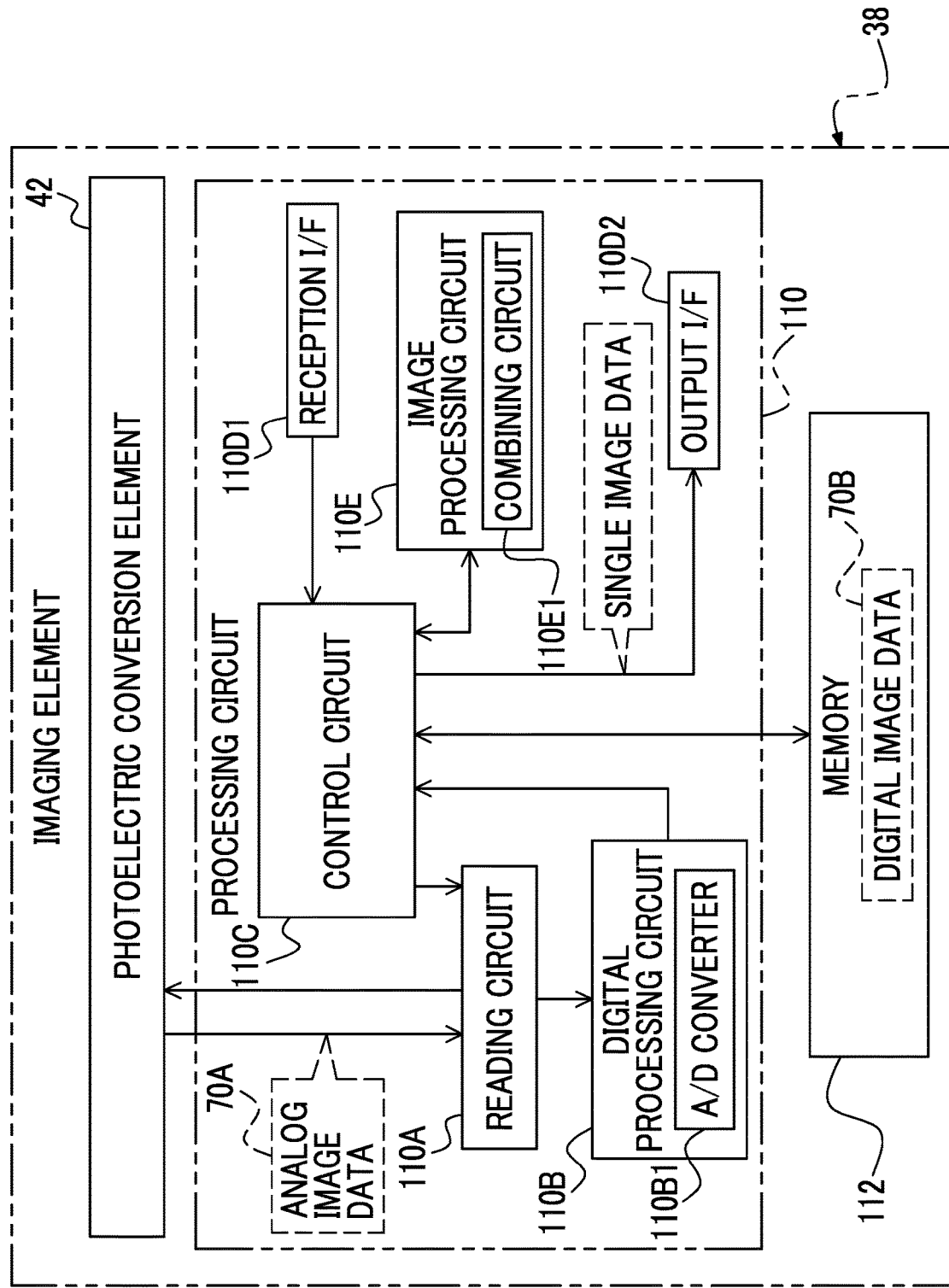
FIG. 20 is a block diagram illustrating an example of a modification example of the configuration of the imaging element according to the embodiment.

In addition, in the embodiment, while an example of a form of combining the plurality of pieces of digital image data 70B using the signal processing circuit 34 positioned on the rear stage of the imaging element 38 is illustratively described, the technology of the present disclosure is not limited thereto. For example, as illustrated in FIG. 20, a combining circuit 110E1 may be incorporated in the image processing circuit 110E. In this case, in the same manner as the combining circuit 34C illustrated in FIG. 16, the single image data may be generated by combining the plurality of pieces of digital image data 70B using the combining circuit 110E1. The control circuit 110C acquires the single image data from the combining circuit 110E1 and outputs the acquired single image data to the signal processing circuit 34 using the output I/F 110D2. Even in this case, the same effect as the embodiment is obtained. In addition, a circuit configuration of the signal processing circuit 34 can be simplified to an extent of not incorporating the combining circuit 34C in the signal processing circuit 34, compared to a case where the combining circuit 34C is incorporated in the signal processing circuit 34.

Figure 21:
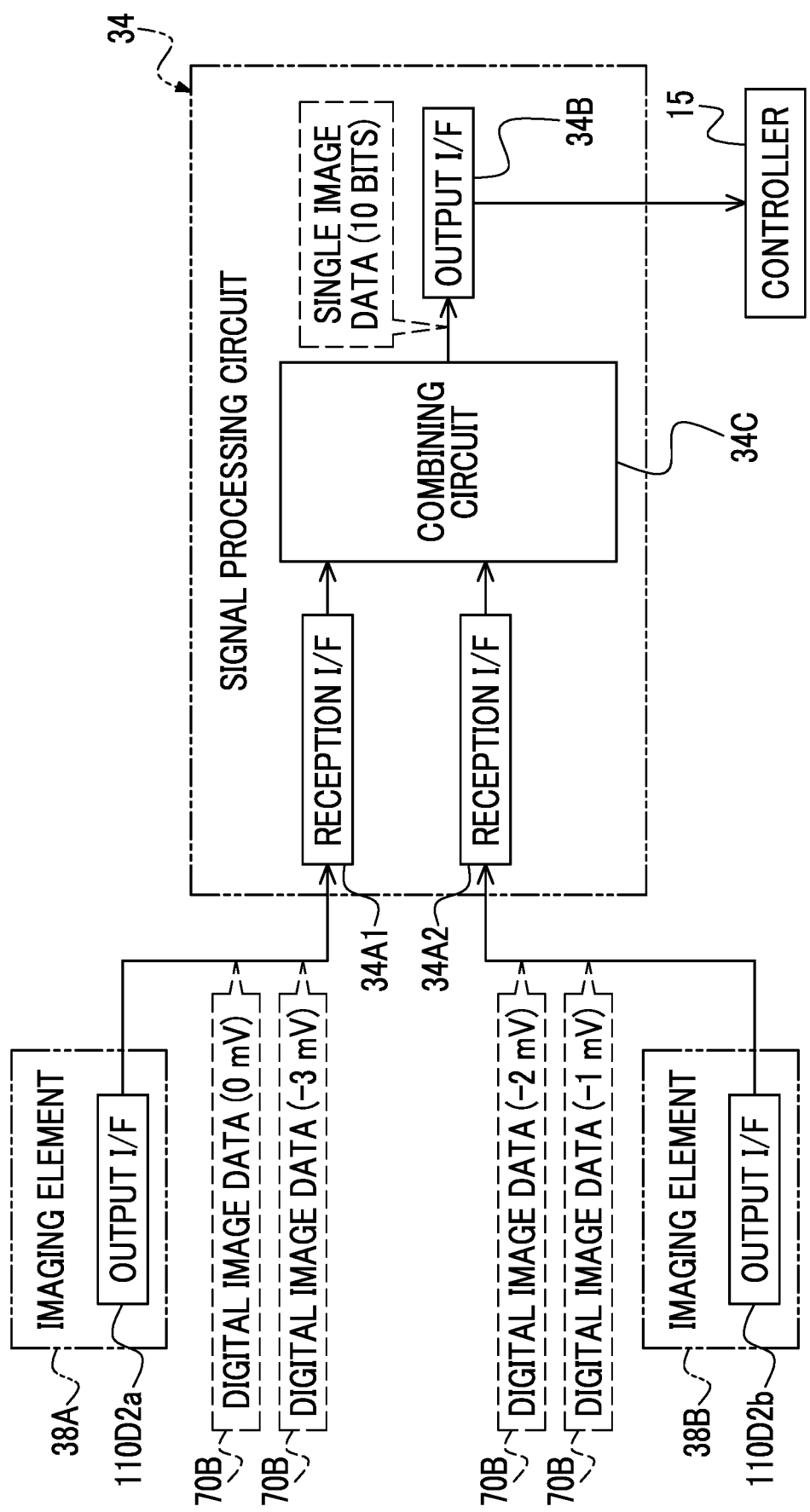
FIG. 21 is a block diagram illustrating an example of a configuration of the first imaging element, the second imaging element, and the signal processing circuit according to the embodiment.

In addition, in the embodiment, an example of a form of outputting the digital image data 70B from each of the first imaging element 38A, the second imaging element 38B, the third imaging element 38C, and the fourth imaging element 38D is illustratively described. However, the technology of the present disclosure is not limited thereto. For example, as illustrated in FIG. 21, the first imaging element 38A may perform the imaging accompanying the A/D conversion of different reference levels a plurality of times, and the second imaging element 38B may perform the imaging accompanying the A/D conversion of different reference levels a plurality of times. In the example illustrated in FIG. 21, the first imaging element 38A performs the imaging accompanying the A/D conversion of the reference level of 0 mV and the imaging accompanying the A/D conversion of the reference level of −3 mV. In addition, the second imaging element 38B performs the imaging accompanying the A/D conversion of the reference level of −2 mV and the imaging accompanying the A/D conversion of the reference level of −1 mV.

The first imaging element 38A performs one imaging out of the imaging accompanying the A/D conversion of the reference level of 0 mV and the imaging accompanying the A/D conversion of the reference level of −3 mV and then, performs the other imaging. The second imaging element 38B performs one imaging out of the imaging accompanying the A/D conversion of the reference level of −2 mV and the imaging accompanying the A/D conversion of the reference level of −1 mV and then, performs the other imaging.

The output I/F 110D2a of the first imaging element 38A outputs the digital image data 70B for which the reference level of the A/D conversion is 0 mV, and the digital image data 70B for which the reference level of the A/D conversion is −3 mV to the signal processing circuit 34. The output I/F 110D2b of the second imaging element 38B outputs the digital image data 70B for which the reference level of the A/D conversion is −2 mV, and the digital image data 70B for which the reference level of the A/D conversion is −1 mV to the signal processing circuit 34.

In the signal processing circuit 34, the digital image data 70B output from the output I/F 110D2a is received by the reception I/F 34A1, and the digital image data 70B output from the output I/F 110D2b is received by the reception I/F 34A2. The digital image data 70B of two frames received by the reception I/F 34A1 and the digital image data 70B of two frames received by the reception I/F 34A2 are combined by the combining circuit 34C. The digital image data 70B of two frames received by the reception I/F 34A1 refers to the digital image data 70B for which the reference level of the A/D conversion is 0 mV, and the digital image data 70B for which the reference level of the A/D conversion is −3 mV. The digital image data 70B of two frames received by the reception I/F 34A2 refers to the digital image data 70B for which the reference level of the A/D conversion is −2 mV, and the digital image data 70B for which the reference level of the A/D conversion is −1 mV.

In such a manner, by combining the digital image data 70B of four frames output from the first imaging element 38A and the second imaging element 38B using the combining circuit 34C, the single image data of 10 bits in units of pixels is generated. The single image data is output to the controller 15 by the output I/F 34B.

According to the present configuration, a load exerted on the imaging element 38 for obtaining the plurality of pieces of digital image data 70B for generating the single image data can be reduced, compared to a case where the plurality of pieces of digital image data 70B for generating the single image data are obtained from only the single imaging element 38.

In the example illustrated in FIG. 21, while an example of a form of performing imaging twice using the single imaging element 38 is illustratively described, the technology of the present disclosure is not limited thereto. Imaging may be performed three times or more by the single imaging element 38. Even in this case, the imaging accompanying the A/D conversion of different reference levels may be performed a plurality of times.

In addition, the imaging accompanying the A/D conversion of different reference levels may be performed a plurality of times by the first imaging element 38A and the second imaging element 38B. For example, the first imaging element 38A may perform the imaging accompanying the A/D conversion of the reference level of 0 mV, and the second imaging element 38B may perform the imaging accompanying the A/D conversion of the reference level of −3 mV, the imaging accompanying the A/D conversion of the reference level of −2 mV, and the imaging accompanying the A/D conversion of the reference level of −1 mV.

In addition, in the example illustrated in FIG. 21, while the first imaging element 38A and the second imaging element 38B are illustrated, the imaging accompanying the A/D conversion of different reference levels may be performed by the first imaging element 38A, the second imaging element 38B, and the third imaging element 38C. For example, the first imaging element 38A may perform the imaging accompanying the A/D conversion of the reference level of 0 mV. The second imaging element 38B may perform the imaging accompanying the A/D conversion of the reference level of −3 mV. The third imaging element 38C may perform the imaging accompanying the A/D conversion of the reference level of −2 mV and the imaging accompanying the A/D conversion of the reference level of −1 mV.

In addition, in the example illustrated in FIG. 21, an example of a form of implementing a plurality of times of imaging with different reference levels of the A/D conversion by sequentially performing the imaging accompanying the A/D conversion of different reference levels using the imaging element 38 is illustrative described. However, the technology of the present disclosure is not limited thereto. For example, the imaging accompanying the A/D conversion of different reference levels may be performed by each of the plurality of imaging elements 38 for the plurality of divided regions obtained by dividing the pixel region of the photoelectric conversion element 42.

Figure 22:
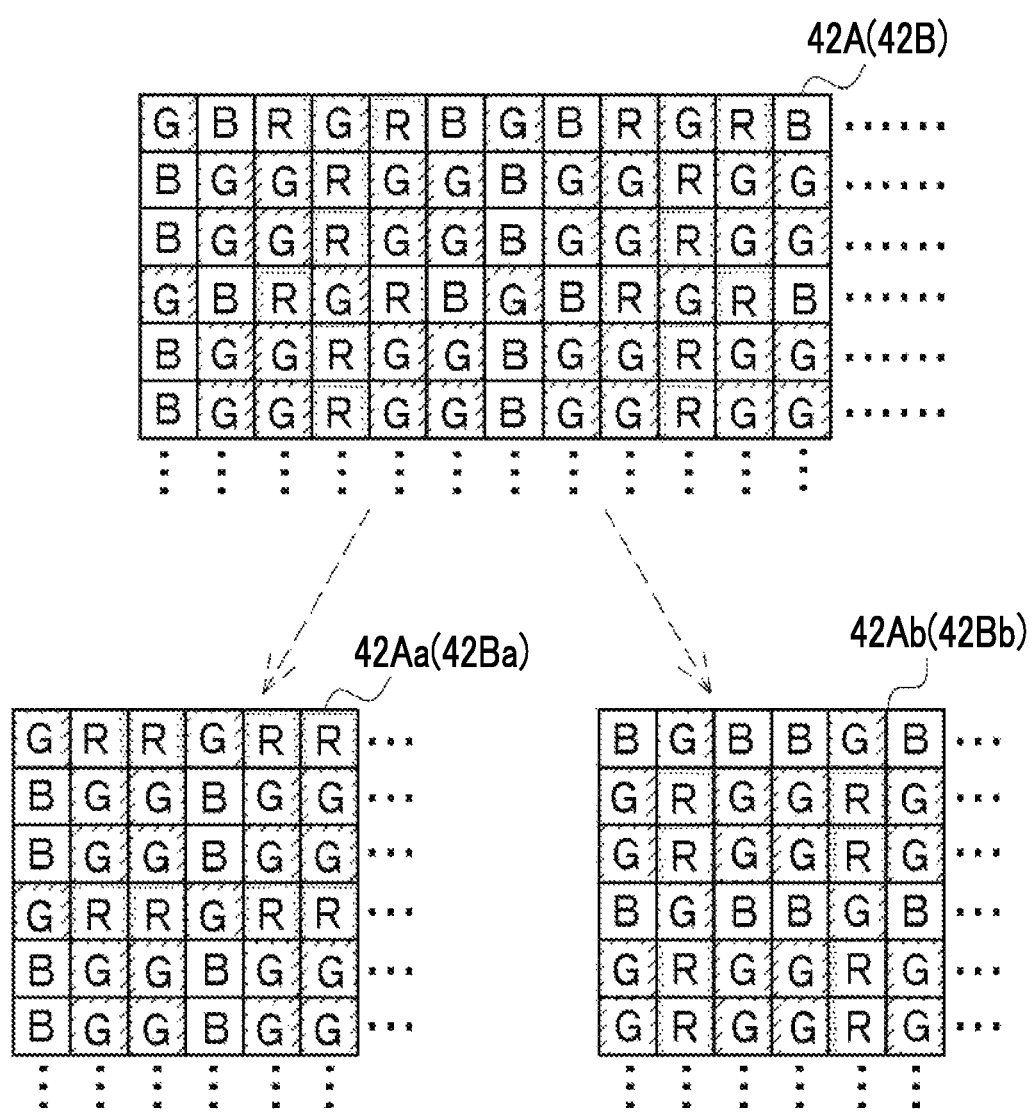
FIG. 22 is a conceptual diagram illustrating an example of the pixel region of the photoelectric conversion element according to the embodiment and a first divided region and a second divided region obtained by dividing the pixel region of the photoelectric conversion element.

In the example illustrated in FIG. 22, a first divided region 42Aa and a second divided region 42Ab obtained by dividing the pixel region of the photoelectric conversion element 42A of the first imaging element 38A into two pixel groups are illustrated. In addition, in the example illustrated in FIG. 22, a first divided region 42Ba and a second divided region 42Bb obtained by dividing the pixel region of the photoelectric conversion element 42B of the second imaging element 38B into two pixel groups are illustrated.

In the example illustrated in FIG. 22, the imaging accompanying the A/D conversion of the reference level of 0 mV is performed for the first divided region 42Aa by the first imaging element 38A. The imaging accompanying the A/D conversion of the reference level of −3 mV is performed for the second divided region 42Ab by the first imaging element 38A. Accordingly, by performing the imaging accompanying the A/D conversion of the reference level of 0 mV using the first imaging element 38A, the digital image data 70B corresponding to the first digital image data 70B1 is generated. In addition, by performing the imaging accompanying the A/D conversion of the reference level of −3 mV using the first imaging element 38A, the digital image data 70B corresponding to the second digital image data 70B2 is generated. The "digital image data 70B corresponding to the first digital image data 70B1" and the "digital image data 70B corresponding to the second digital image data 70B2" are an example of a "plurality of pieces of first image data" according to the embodiment of the technology of the present disclosure. In addition, 0 mV and −3 mV are an example of "different first reference levels" according to the embodiment of the technology of the present disclosure.

In addition, in the example illustrated in FIG. 22, the imaging accompanying the A/D conversion of the reference level of −2 mV is performed for the first divided region 42Ba by the second imaging element 38B. The imaging accompanying the A/D conversion of the reference level of −1 mV is performed for the second divided region 42Bb by the second imaging element 38B. Accordingly, by performing the imaging accompanying the A/D conversion of the reference level of −2 mV using the second imaging element 38B, the digital image data 70B corresponding to the third digital image data 70B3 is generated. In addition, by performing the imaging accompanying the A/D conversion of the reference level of −1 mV using the second imaging element 38B, the digital image data 70B corresponding to the fourth digital image data 70B4 is generated. The "digital image data 70B corresponding to the third digital image data 70B3" and the "digital image data 70B corresponding to the fourth digital image data 70B4" are an example of a "plurality of pieces of second image data" according to the embodiment of the technology of the present disclosure. In addition, −2 mV and −1 mV are an example of "different second reference levels" according to the embodiment of the technology of the present disclosure.

According to the present configuration, the load exerted on the imaging element 38 for obtaining the plurality of pieces of digital image data 70B for generating the single image data can be reduced, compared to a case where the plurality of pieces of digital image data 70B for generating the single image data are obtained from only the single imaging element 38.

In addition, in the embodiment, while an example of a form of generating the single image data of 10 bits in units of pixels based on the digital image data 70B of 8 bits in units of pixels is illustratively described, the technology of the present disclosure is not limited thereto. For example, as illustrated in FIG. 23, the single image data of 10 bits in units of pixels may be generated by adding the first digital image data 70B1 of 9 bits in units of pixels and the second digital image data 70B2 of 9 bits in units of pixels using the combining circuit 34C.

Figure 23:
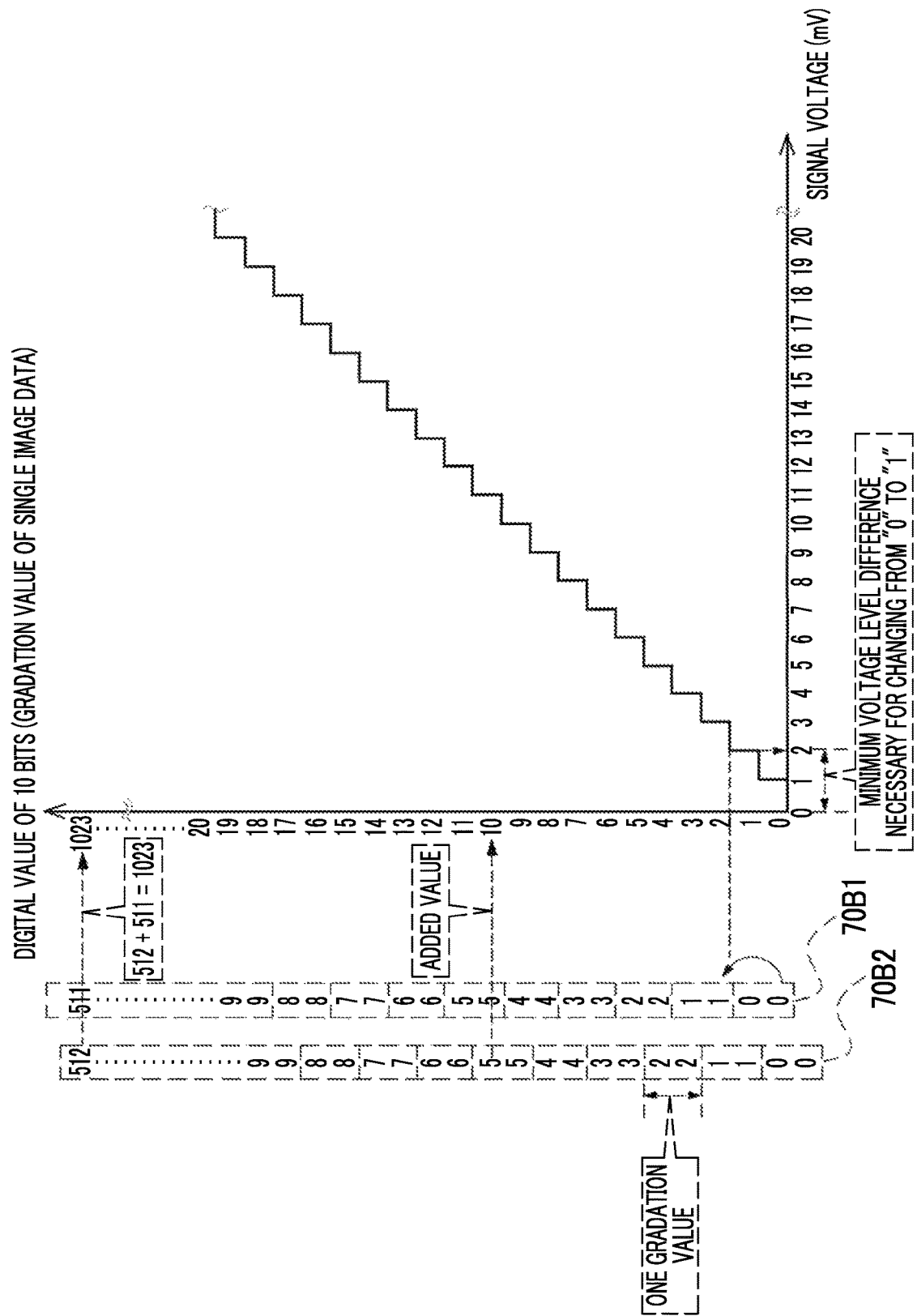
FIG. 23 is a conceptual diagram illustrating an example of a correspondence relationship among the driving signal voltage for the A/D converter according to the embodiment, the digital value of the single image data of 10 bits in units of pixels, the digital value of the first digital image data of 9 bits in units of pixels, and the digital value of the second digital image data of 9 bits in units of pixels.

FIG. 23 illustrates a graph illustrating an example of correlation between the driving signal voltage for the A/D converter 110B1 and the digital value of the single image data of 10 bits in units of pixels. In the graph illustrated in FIG. 23, a horizontal axis denotes the signal voltage, and a vertical axis denotes the digital value of the single image data of 10 bits in units of pixels. In addition, in FIG. 23, an example of a correspondence relationship among the digital value of the first digital image data 70B1 of 9 bits in units of pixels, the digital value of the second digital image data 70B2 of 9 bits in units of pixels, and the digital value of the single image data of 10 bits in units of pixels is illustrated.

As illustrated in FIG. 23 as an example, the gradation value of the digital image data 70B is "512". The minimum voltage level difference necessary for increasing the gradation value of the digital image data 70B by "1" using the A/D converter 110B1 is 2 mV. For example, the minimum voltage level difference necessary for changing the gradation value of the digital image data 70B from "0" to "1" is 2 mV. That is, in a case of changing the gradation value by 1 at a time from "0" to "512", the A/D converter 110B1 requires a signal voltage of "Y (=integer greater than or equal to 1)×2" mV. The signal voltage required for changing the gradation value of 9 bits by 1 at a time is calculated by incrementing Y of "Y×2" by 1.

In such a manner, the A/D converter 110B1 requires a voltage level difference of 2 mV in order to increase the gradation value of 9 bits by "1". Therefore, in the example illustrated in FIG. 23, for convenience of description, one gradation value for each of the first digital image data 70B1 and the second digital image data 70B2 is represented by lining up the same two numerical values in order to facilitate understanding of a relationship between the gradation values of the first digital image data 70B1 and the second digital image data 70B2 and a relationship between the gradation value of 9 bits and the gradation value of 10 bits.

As illustrated in FIG. 23 as an example, a difference (1 mV) in reference level between the first digital image data 70B1 and the second digital image data 70B2 is less than the minimum voltage level difference (2 mV) necessary for increasing the gradation value of the digital image data 70B by "1" using the A/D converter 110B1.

The difference (1 mV) in reference level between the first digital image data 70B1 and the second digital image data 70B2 is a value corresponding to a value obtained by dividing, by the number of frames of the digital image data 70B, the minimum voltage level difference (2 mV) necessary for increasing the gradation value of the digital image data 70B by "1" using the A/D converter 110B1. The "number of frames of the digital image data 70B" here refers to two frames of the first digital image data 70B1 and the second digital image data 70B2.

In the example illustrated in FIG. 23, gradation values "0 to 511" of the first digital image data 70B1 are lined up along the vertical axis of the graph in a state where the positions of the gradation value "0" of the first digital image data 70B1 and the gradation value "0" of 10 bits are matched. In addition, gradation values "0 to 512" of the second digital image data 70B2 are lined up along the vertical axis of the graph in a state where the first digital image data 70B1 and the second digital image data 70B2 are shifted in the vertical axis direction of the graph by the difference in reference level therebetween.

An example of a form of generating image data (single image data) of 10 bits by combining a plurality of pieces of image data (digital image data 70B) of 8 bits and an example of a form (refer to FIG. 23) of generating the image data of 10 bits by combining a plurality of pieces of image data of 9 bits are illustratively described above. However, in a case where A denotes an integer greater than or equal to 1, and B denotes an integer greater than A, single image data of B bits may be generated by combining a plurality of pieces of image data of A bits.

As illustrated in FIG. 23 as an example, the gradation value of the single image data of 10 bits in units of pixels is a value obtained by adding the gradation values of the first digital image data 70B1 and the second digital image data 70B2. For example, by adding the gradation value "5" of the second digital image data 70B2 and the gradation value "5" of the first digital image data 70B1 using the combining circuit 34C (refer to FIG. 11 and FIG. 12), "10" is obtained as the gradation value of the single image data of 10 bits in units of pixels. In addition, for example, by adding the gradation value "512" of the second digital image data 70B2 and the gradation value "511" of the first digital image data 70B1 using the combining circuit 34C (refer to FIG. 11 and FIG. 12), "1023" is obtained as the gradation value of the single image data of 10 bits in units of pixels.

In addition, in the embodiment, while the imaging element in which the photoelectric conversion element 42, the processing circuit 110, and the memory 112 are formed in one chip is illustrated as the imaging element 38, the technology of the present disclosure is not limited thereto. For example, at least the photoelectric conversion element 42 and the memory 112 among the photoelectric conversion element 42, the processing circuit 110, and the memory 112 may be formed in one chip.

In addition, in the embodiment, while the communication I/Fs are connected in accordance with the PCI-e connection standard, the technology of the present disclosure is not limited thereto. Instead of the PCI-e connection standard, other connection standards such as LVDS, SATA, SLVS-EC, or MIPI may be employed.

In addition, in the embodiment, all of communication between the imaging element 38 and the signal processing circuit 34, communication between the controller 15 and the imaging element 38, and communication between the signal processing circuit 34 and the controller 15 are wired communication. However, the technology of the present disclosure is not limited thereto. Communication between the imaging element 38 and the signal processing circuit 34, communication between the controller 15 and the imaging element 38, and/or communication between the signal processing circuit 34 and the controller 15 may be wireless communication.

In addition, in the embodiment, an example of a form of generating the reference level for each of the first imaging element 38A, the second imaging element 38B, the third imaging element 38C, and the fourth imaging element 38D using the reference level generation circuit 38A1 (refer to FIG. 10) is illustratively described. However, the technology of the present disclosure is not limited thereto. For example, the first imaging element 38A, the second imaging element 38B, the third imaging element 38C, and the fourth imaging element 38D may generate the reference levels independently of each other.

In addition, in the embodiment, while an example of a form of incorporating the UI system device 17 in the smart device 10 is illustratively described, at least a part of a plurality of constituents included in the UI system device 17 may be externally attached to the smart device 10. In addition, at least a part of the plurality of constituents included in the UI system device 17 may be used as being connected to the external I/F 104 as a separate body.

In addition, in the embodiment, while 120 fps is illustrated as the frame rate, the technology of the present disclosure is not limited thereto. An imaging frame rate (for example, the frame rate applied to the imaging processing illustrated in FIG. 9) and an output frame rate (for example, the frame rate applied to the output processing illustrated in FIG. 9) may be different frame rates. The imaging frame rate and/or the output frame rate may be a fixed frame rate or may be a variable frame rate. In a case of the variable frame rate, for example, the frame rate may be changed in a case where a predetermined condition (for example, a condition that an instruction to change the frame rate is received by the reception device 84, and/or a condition that a timing decided in advance as a timing for changing the frame rate is reached) is satisfied. In a case of the variable frame rate, for example, a specific numerical value of the frame rate may be changed in accordance with the instruction received by the reception device 84 or may be changed in accordance with an operation rate of the rear stage circuit 13 and/or the imaging element 38.

Figure 24:
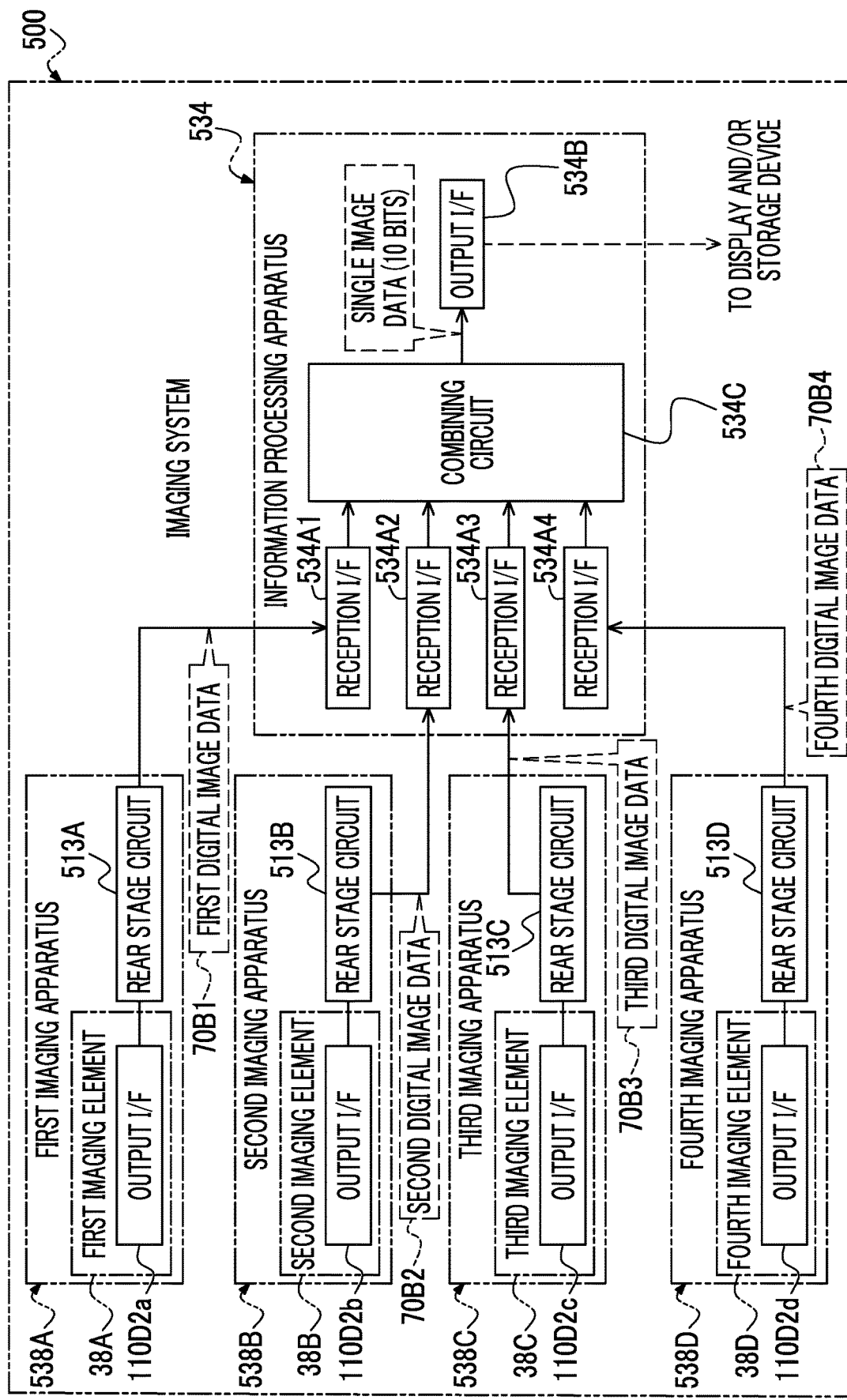
FIG. 24 is a block diagram illustrating an example of a configuration of an imaging system in a case where digital image data of four frames obtained by performing imaging using a first imaging apparatus, a second imaging apparatus, a third imaging apparatus, and a fourth imaging apparatus is combined by an information processing apparatus.

In addition, in the embodiment, while the smart device 10 including the imaging element unit 14 is illustrated, the technology of the present disclosure is not limited thereto. For example, as illustrated in FIG. 24, the technology of the present disclosure is also established for an imaging system 500 including a first imaging apparatus 538A, a second imaging apparatus 538B, a third imaging apparatus 538C, and a fourth imaging apparatus 538D. An interchangeable lens camera is exemplified as an example of the first imaging apparatus 538A, the second imaging apparatus 538B, the third imaging apparatus 538C, and the fourth imaging apparatus 538D. Here, while the interchangeable lens camera is exemplified as an example of the first imaging apparatus 538A, the second imaging apparatus 538B, the third imaging apparatus 538C, and the fourth imaging apparatus 538D, the technology of the present disclosure is not limited thereto. Cameras of multiple types such as a fixed lens camera may be used.

In the example illustrated in FIG. 24, the imaging system 500 comprises an information processing apparatus 534 in addition to the first imaging apparatus 538A, the second imaging apparatus 538B, the third imaging apparatus 538C, and the fourth imaging apparatus 538D. For example, a smart device, a personal computer, or a server is exemplified as the information processing apparatus 534. The information processing apparatus 534 comprises a reception I/F 534A1 corresponding to the reception I/F 34A1 described in the embodiment, a reception I/F 534A2 corresponding to the reception I/F 34A2 described in the embodiment, a reception I/F 534A3 corresponding to the reception I/F 34A3 described in the embodiment, and a reception I/F 534A4 corresponding to the reception I/F 34A4 described in the embodiment. In addition, the information processing apparatus 534 comprises a combining circuit 534A corresponding to the combining circuit 34C described in the embodiment. Furthermore, the information processing apparatus 534 comprises an output I/F 534B corresponding to the output I/F 34B described in the embodiment.

The first imaging apparatus 538A comprises the first imaging element 38A. In addition, the first imaging apparatus 538A comprises a rear stage circuit 513A corresponding to the rear stage circuit 13 described in the embodiment. The rear stage circuit 513A receives the first digital image data 70B1 output from the output I/F 110D2*a* of the first imaging element 38A and outputs the received first digital image data 70B1 to the information processing apparatus 534.

The second imaging apparatus 538B comprises the second imaging element 38B. In addition, the second imaging apparatus 538B comprises a rear stage circuit 513B corresponding to the rear stage circuit 13 described in the embodiment. The rear stage circuit 513B receives the second digital image data 70B2 output from the output I/F 110D2*b* of the second imaging element 38B and outputs the received second digital image data 70B2 to the information processing apparatus 534.

The third imaging apparatus 538C comprises the third imaging element 38C. In addition, the third imaging apparatus 538C comprises a rear stage circuit 513C corresponding to the rear stage circuit 13 described in the embodiment. The rear stage circuit 513C receives the third digital image data 70B3 output from the output I/F 110D2*c* of the third imaging element 38C and outputs the received third digital image data 70B3 to the information processing apparatus 534.

The fourth imaging apparatus 538D comprises the fourth imaging element 38D. In addition, the fourth imaging apparatus 538D comprises a rear stage circuit 513D corresponding to the rear stage circuit 13 described in the embodiment. The rear stage circuit 513D receives the fourth digital image data 70B4 output from the output I/F 110D2*d* of the fourth imaging element 38D and outputs the received fourth digital image data 70B4 to the information processing apparatus 534.

The reception I/F 534A1 receives the first digital image data 70B1 from the first imaging apparatus 538A. The reception I/F 534A2 receives the second digital image data 70B2 from the second imaging apparatus 538B. The reception I/F 534A3 receives the third digital image data 70B3 from the third imaging apparatus 538C. The reception I/F 534A4 receives the fourth digital image data 70B4 from the fourth imaging apparatus 538D.

The combining circuit 534C generates the single image data described in the embodiment by combining the first digital image data 70B1 received by the reception I/F 534A1, the second digital image data 70B2 received by the reception I/F 534A2, the third digital image data 70B3 received by the reception I/F 534A3, and the fourth digital image data 70B4 received by the reception I/F 534A4.

The single image data generated by the combining circuit 534C is output to an external apparatus such as a display and/or a storage device by the output I/F 534B. The image based on the single image data is displayed on the display, or the single image data is stored in the storage device.

Even with the imaging system 500 configured in such a manner, the same action and effect as the embodiment are obtained. The imaging system 500 is an example of an "imaging apparatus" according to the embodiment of the technology of the present disclosure. The information processing apparatus 534 is an example of the "processing portion" according to the embodiment of the technology of the present disclosure.

In addition, in the embodiment, while the device including the ASIC and the FPGA is illustrated as the signal processing circuit 34, the technology of the present disclosure is not limited thereto. The signal processing circuit 34 may be implemented by a software configuration using a computer.

Figure 25:
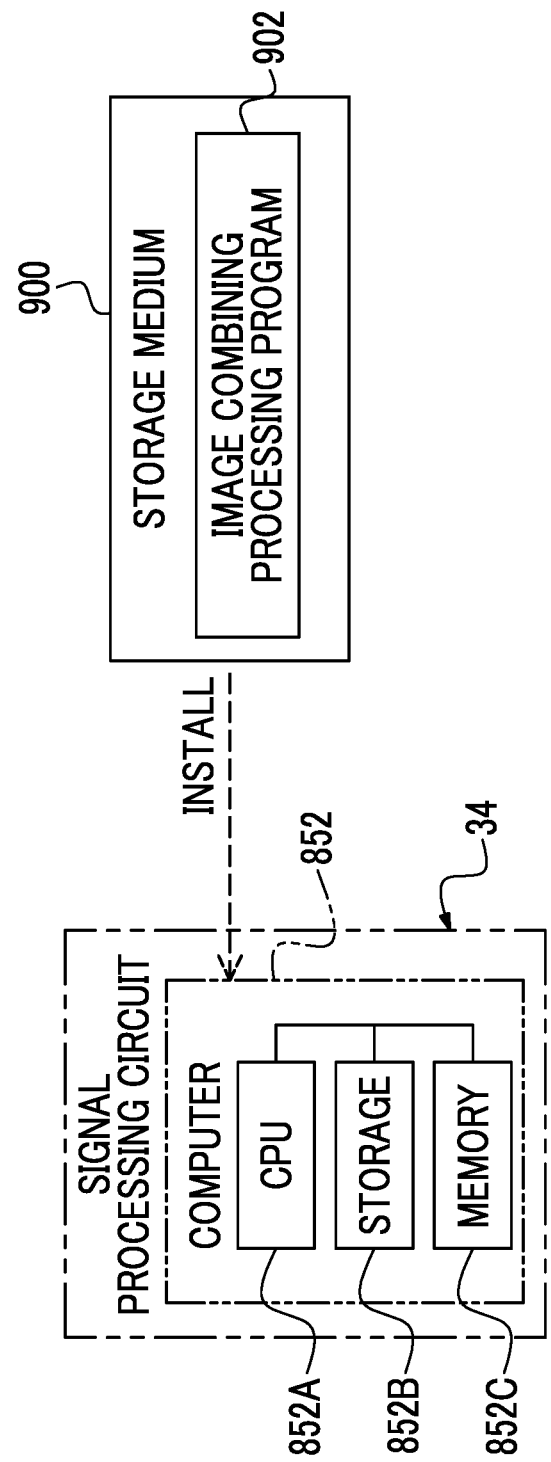
FIG. 25 is a conceptual diagram illustrating an example of an aspect in which an image combining processing program is installed on a computer in the signal processing circuit from a storage medium storing the image combining processing program.

In this case, for example, as illustrated in FIG. 25, a computer 852 is incorporated in the signal processing circuit 34, and an image combining processing program 902 causing the computer 852 to execute the image combining processing according to the embodiment is stored in a storage medium 900. Any portable storage medium such as an SSD or a USB memory that is a non-temporary storage medium is exemplified as an example of the storage medium 900.

The computer 852 comprises a CPU 852A, a storage 852B, and a memory 852C. The CPU 852A is an example of the "processor" according to the embodiment of the technology of the present disclosure, and the memory 852C is an example of the "memory" according to the embodiment of the technology of the present disclosure. The storage 852B is a non-volatile storage device such as an EEPROM, and the memory 852C is a volatile storage device such as a RAM. The image combining processing program 902 stored in the storage medium 900 is installed on the computer 852.

The CPU 852A executes the image combining processing in accordance with the image combining processing program 902.

The image combining processing program 902 may be stored in the storage 852B instead of the storage medium 900. In this case, the CPU 852A reads out the image combining processing program 902 from the storage 852B and loads the read image combining processing program 902 into the memory 852C. The CPU 852A executes the image combining processing in accordance with the image combining processing program 902 loaded in the memory 852C.

In addition, the image combining processing program 902 may be stored in a storage portion of another computer, a server apparatus, or the like connected to the computer 852 through a communication network (not illustrated), and the image combining processing program 902 may be downloaded to the computer 852 in response to a request from the smart device 10 and be installed on the computer 852.

The entire image combining processing program 902 does not need to be stored in the storage portion of the other computer, the server apparatus, or the like connected to the computer 852. A part of the image combining processing program 902 may be stored.

In the example illustrated in FIG. 25, while an example of a form of incorporating the computer 852 in the signal processing circuit 34 is illustrated, the technology of the present disclosure is not limited thereto. For example, the computer 852 may be disposed on an outside of the signal processing circuit 34.

In the example illustrated in FIG. 25, the CPU 852A may be a single CPU or include a plurality of CPUs. In addition, a GPU may be applied instead of the CPU 852A.

In the example illustrated in FIG. 25, while the computer 852 is illustrated, the technology of the present disclosure is not limited thereto. A device including an ASIC, an FPGA, and/or a PLD may be applied instead of the computer 852. In addition, a combination of a hardware configuration and a software configuration may be used instead of the computer 852.

Figure 26:
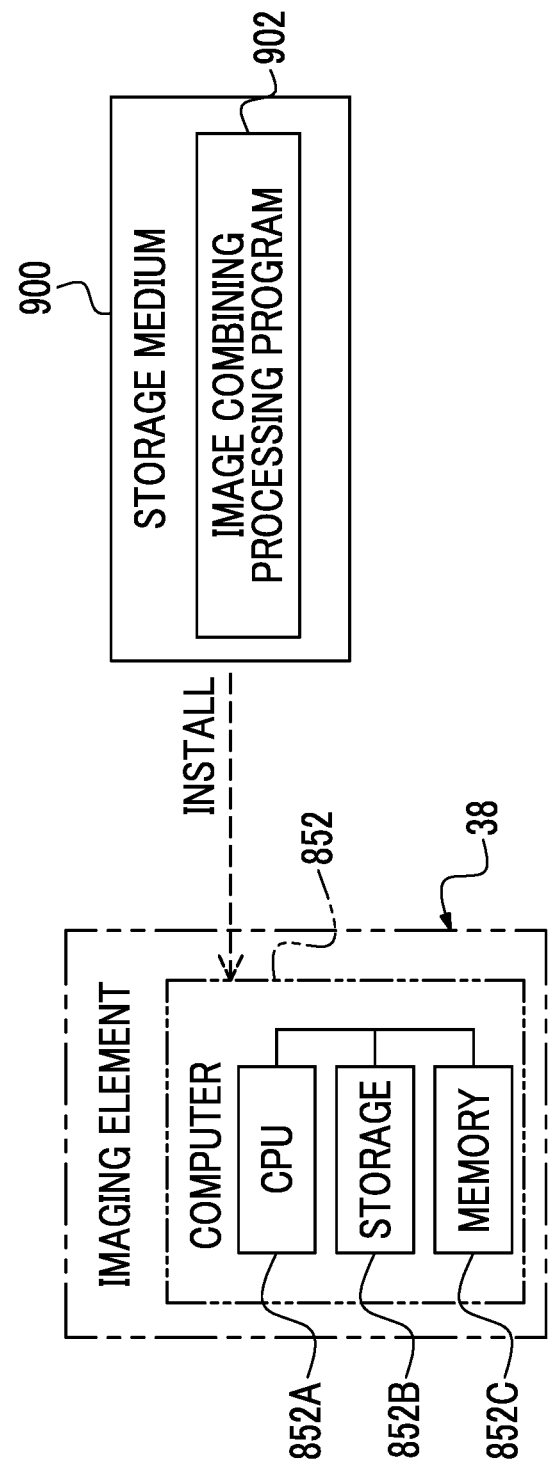
FIG. 26 is a conceptual diagram illustrating an example of an aspect in which the image combining processing program is installed on a computer in the imaging element from the storage medium storing the image combining processing program.

In addition, in the same manner as the example illustrated in FIG. 25, even for the imaging element 38 illustrated in FIG. 20, as illustrated in FIG. 26 as an example, the computer 852 may be applied instead of the processing circuit 110, or the computer 852 may be applied instead of at least the combining circuit 110E1 in the processing circuit 110.

Various processors illustrated below can be used as a hardware resource for executing the image combining processing described in the embodiment. For example, as described above, a CPU that is a general-purpose processor functioning as the hardware resource for executing the image combining processing by executing software, that is, the program, is exemplified as a processor. In addition, a dedicated electric circuit such as an FPGA, a PLD, or an ASIC that is a processor having a circuit configuration dedicatedly designed to execute a specific type of processing is exemplified as a processor. A memory is incorporated in or connected to any of the processors, and any of the processors executes the image combining processing using the memory.

The hardware resource for executing the image combining processing may be configured with one of those various processors or may be configured with a combination of two or more processors of the same type or different types (for example, a combination of a plurality of FPGAs or a combination of a CPU and an FPGA). In addition, the hardware resource for executing the image combining processing may be one processor.

As an example of a configuration with one processor, first, as represented by a computer such as a client and a server, a form in which one processor is configured with a combination of one or more CPUs and software, and in which this processor functions as a hardware resource for executing the image combining processing is available. Second, as represented by an SoC or the like, a form of using a processor that implements, by one IC chip, a function of the entire system including a plurality of hardware resources for executing the image combining processing is available. In such a manner, the image combining processing is implemented using one or more of the various processors as the hardware resource.

Furthermore, as a hardware structure of those various processors, more specifically, an electric circuit in which circuit elements such as semiconductor elements are combined can be used.

In addition, while the smart device 10 is illustrated in the example illustrated in FIG. 1, the technology of the present disclosure is not limited thereto. That is, the technology of the present disclosure can be applied to various electronic apparatuses (for example, an interchangeable lens camera, a fixed lens camera, a personal computer, and/or a wearable terminal apparatus or the like) incorporating the plurality of imaging elements 38 and the signal processing circuit 34. Even with these electronic apparatuses, the same action and effect as the smart device 10 are obtained.

In addition, while the display 26 is illustrated in the embodiment, the technology of the present disclosure is not limited thereto. For example, a separate display that is retrofit into the imaging apparatus may be used as the "display portion (display)" according to the embodiment of the technology of the present disclosure.

In addition, the various types of processing are merely an example. Accordingly, unnecessary steps may be deleted, new steps may be added, or a processing order may be rearranged without departing from a gist of the technology of the present disclosure.

Above-described contents and illustrated contents are detailed description for parts according to the embodiment of the technology of the present disclosure and are merely an example of the technology of the present disclosure. For example, description related to the above configurations, functions, actions, and effects is description related to an example of configurations, functions, actions, and effects of the parts according to the embodiment of the technology of the present disclosure. Thus, unnecessary parts may be removed, new elements may be added, or parts may be replaced in the above-described contents and the illustrated contents without departing from the gist of the technology of the present disclosure. In addition, particularly, description related to common technical knowledge or the like that does not need to be described in terms of embodying the technology of the present disclosure is omitted in the above-described contents and the illustrated contents in order to avoid complication and facilitate understanding of the parts according to the embodiment of the technology of the present disclosure.

In the present specification, "A and/or B" has the same meaning as "at least one of A or B". This means that "A and/or B" may be only A, only B, or a combination of A and B. In addition, in the present specification, the same approach as "A and/or B" is applied to a case where three or more matters are represented by connecting the matters with "and/or".

All documents, patent applications, and technical standards disclosed in the present specification are incorporated in the present specification by reference to the same extent as in a case where each of the documents, patent applications, technical standards are specifically and individually indicated to be incorporated by reference.

The following appendices are further disclosed with respect to the embodiment.

(Appendix 1)

An imaging apparatus including an imaging element, and a processor, in which the processor is configured to generate single image data by combining a plurality of pieces of image data output from the imaging element, and output the generated single image data, the plurality of pieces of image data are image data generated by performing imaging accompanying A/D conversion of different reference levels, and the number of bits, in units of pixels, of the single image data output from the processor is greater than the number of bits of each of the plurality of pieces of image data in units of pixels.

(Appendix 2)

An imaging element including a photoelectric conversion element incorporated in the imaging element, and a processor that is incorporated in the imaging element and is configured to generate single image data by combining a plurality of pieces of image data output from the photoelectric conversion element and output the generated single image data, in which the plurality of pieces of image data are image data generated by performing imaging accompanying A/D conversion of different reference levels, and the number of bits of the single image data output from the processor is greater than the number of bits of each of the plurality of pieces of image data.

What is claimed is:

1. An imaging apparatus comprising:
an imaging element; and
a processor configured to generate single image data by combining a plurality of pieces of image data output from the imaging element and output the generated single image data,
wherein the plurality of pieces of image data have the same signal value range and are image data generated by performing imaging accompanying A/D conversion of different reference levels, and
the number of bits, in units of pixels, of the single image data output from the processor is greater than the number of bits of each of the plurality of pieces of image data in units of pixels.

2. The imaging apparatus according to claim 1,
wherein the imaging element generates the plurality of pieces of image data by performing the imaging accompanying the A/D conversion of different reference levels for a plurality of divided regions obtained by dividing a pixel region of the imaging element, and
the processor is configured to generate the single image data by combining the plurality of pieces of image data generated for the plurality of divided regions.

3. The imaging apparatus according to claim 1,
wherein the plurality of pieces of image data are output from a plurality of the imaging elements.

4. The imaging apparatus according to claim 3,
wherein at least one imaging element of the plurality of imaging elements generates a plurality of pieces of image data of different reference levels by performing the imaging accompanying the A/D conversion of different reference levels a plurality of times.

5. The imaging apparatus according to claim 3,
wherein an imaging element of a part of the plurality of imaging elements generates a plurality of pieces of first image data by performing imaging accompanying the A/D conversion of different first reference levels,
the remaining imaging elements of the plurality of imaging elements generate a plurality of pieces of second image data by performing imaging accompanying the A/D conversion of different second reference levels, and
the processor is configured to generate the single image data by combining the plurality of pieces of first image data and the plurality of pieces of second image data.

6. The imaging apparatus according to claim 3,
wherein the processor is configured to generate the single image data using multiplied signal value image data obtained by multiplying a signal value of the image data obtained by performing the imaging using at least one of the plurality of imaging elements.

7. The imaging apparatus according to claim 3,
wherein any of the plurality of imaging elements supplies the reference level related to each of the remaining imaging elements to a corresponding imaging element of the remaining imaging elements.

8. The imaging apparatus according to claim 1,
wherein the processor is configured to perform processing of combining the plurality of pieces of image data by addition.

9. The imaging apparatus according to claim 1,
wherein a difference in the reference level between the plurality of pieces of image data is less than a minimum voltage level difference necessary for changing individual digital values of the plurality of pieces of image data.

10. The imaging apparatus according to claim 9,
wherein the difference in the reference level between the plurality of pieces of image data is a value corresponding to a value obtained by dividing the voltage level difference by the number of frames of the plurality of pieces of image data.

11. The imaging apparatus according to claim 1,
wherein at least a photoelectric conversion element and a memory are formed in one chip in the imaging element.

12. The imaging apparatus according to claim 11,
wherein the imaging element is a laminated imaging element in which the photoelectric conversion element is laminated with the memory.

13. The imaging apparatus according to claim 1, further comprising:
a control device that performs at least one of a control for displaying an image based on the single image data output by the processor on a display or a control for storing the single image data output by the processor in a storage device.

14. An imaging element comprising:
a photoelectric conversion element incorporated in the imaging element; and
a processor that is incorporated in the imaging element and is configured to generate single image data by combining a plurality of pieces of image data output from the photoelectric conversion element and output the generated single image data,
wherein the plurality of pieces of image data have the same signal value range and are image data generated by performing imaging accompanying A/D conversion of different reference levels, and the number of bits of the single image data output from the processor is greater than the number of bits of each of the plurality of pieces of image data.

15. An operation method of an imaging apparatus, the operation method comprising:
  generating single image data by combining a plurality of pieces of image data output from an imaging element; and
  outputting the generated single image data,
  wherein the plurality of pieces of image data have the same signal value range and are image data generated by performing imaging accompanying A/D conversion of different reference levels, and
  the number of bits of the output single image data in units of pixels is greater than the number of bits of each of the plurality of pieces of image data in units of pixels.

16. An operation method of an imaging element, the operation method comprising:
  generating single image data by combining a plurality of pieces of image data output from a photoelectric conversion element incorporated in the imaging element; and
  outputting the generated single image data,
  wherein the plurality of pieces of image data have the same signal value range and are image data generated by performing imaging accompanying A/D conversion of different reference levels, and
  the number of bits of the output single image data in units of pixels is greater than the number of bits of each of the plurality of pieces of image data in units of pixels.

17. A non-transitory computer-readable storage medium storing a program for causing a computer to execute a process comprising:
  generating single image data by combining a plurality of pieces of image data output from an imaging element; and
  outputting the generated single image data,
  wherein the plurality of pieces of image data have the same signal value range and are image data generated by performing imaging accompanying A/D conversion of different reference levels, and
  the number of bits of the output single image data in units of pixels is greater than the number of bits of each of the plurality of pieces of image data in units of pixels.

18. A non-transitory computer-readable storage medium storing a program for causing a computer to execute a process comprising:
  generating single image data by combining a plurality of pieces of image data output from a photoelectric conversion element incorporated in an imaging element; and
  outputting the generated single image data,
  wherein the plurality of pieces of image data have the same signal value range and are image data generated by performing imaging accompanying A/D conversion of different reference levels, and
  the number of bits of the output single image data in units of pixels is greater than the number of bits of each of the plurality of pieces of image data in units of pixels.

* * * * *